(12) United States Patent
Tsukamoto et al.

(10) Patent No.: US 8,274,822 B2
(45) Date of Patent: Sep. 25, 2012

(54) NONVOLATILE MEMORY DEVICE AND METHOD FOR DRIVING SAME

(75) Inventors: Takayuki Tsukamoto, Mie-ken (JP); Yoichi Minemura, Mie-ken (JP); Natsuki Kikuchi, Mie-ken (JP); Mitsuru Sato, Mie-ken (JP); Hiroshi Kanno, Mie-ken (JP); Takafumi Shimotori, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 43 days.

(21) Appl. No.: 13/018,757

(22) Filed: Feb. 1, 2011

(65) Prior Publication Data
US 2011/0286260 A1  Nov. 24, 2011

(30) Foreign Application Priority Data
May 20, 2010  (JP) ................................. 2010-116499

(51) Int. Cl.
*G11C 11/00* (2006.01)
(52) U.S. Cl. ........................................ 365/163; 365/148
(58) Field of Classification Search .................. 365/163, 365/148
See application file for complete search history.

(56) References Cited

U.S. PATENT DOCUMENTS

| 6,928,022 | B2 * | 8/2005 | Cho et al. .................... 365/225.7 |
| 7,593,249 | B2 | 9/2009 | Fasoli et al. |
| 7,633,100 | B2 * | 12/2009 | Cho et al. ...................... 257/256 |
| 8,134,866 | B2 * | 3/2012 | Bae et al. ....................... 365/163 |
| 2008/0025076 | A1 * | 1/2008 | Scheuerlein et al. .......... 365/163 |

OTHER PUBLICATIONS

U.S. Appl. No. 13/052,174, filed Mar. 21, 2011, Shimotori, et al.

\* cited by examiner

*Primary Examiner* — Anh Phung
(74) *Attorney, Agent, or Firm* — Oblon, Spivak, McClelland, Maier & Neustadt, L.L.P.

(57) ABSTRACT

According to one embodiment, a nonvolatile memory device includes a memory unit and a control unit. The memory unit includes first and second interconnects, and a memory cell. The second interconnect is non-parallel to the first interconnect. The memory cell includes a resistance change layer provided at an intersection between the first and second interconnects. The control unit is connected to the first and second interconnects to supply voltage and current to the resistance change layer. The control unit increases an upper limit of a current supplied to the first interconnect based on a change of a potential of the first interconnect when applying a set operation voltage to the first interconnect in a set operation of changing the resistance change layer from a first state with a first resistance value to a second state with a second resistance value being less than the first resistance value.

20 Claims, 14 Drawing Sheets

NONVOLATILE MEMORY DEVICE AND METHOD FOR DRIVING SAME

CROSS-REFERENCE TO RELATED APPLICATIONS

This application is based upon and claims the benefit of priority from the prior Japanese Patent Application No. 2010-116499, filed on May 20, 2010; the entire contents of which are incorporated herein by reference.

FIELD

Embodiments described herein relate generally to a nonvolatile memory device and a method for driving the same.

BACKGROUND

Resistance change memory is drawing attention as a next-generation nonvolatile memory because the characteristics do not deteriorate easily even when downscaled and because it is easy to increase the capacity. Resistance change memory utilizes the characteristic of a resistance of a resistance change film changing when electrical energy is provided to the resistance change film.

In such resistance change memory, there is room for improvement to increase the controllability of operations. For example, more stable control of the resistance state of the resistance change film is desirable.

DETAILED DESCRIPTION

Figure 1:
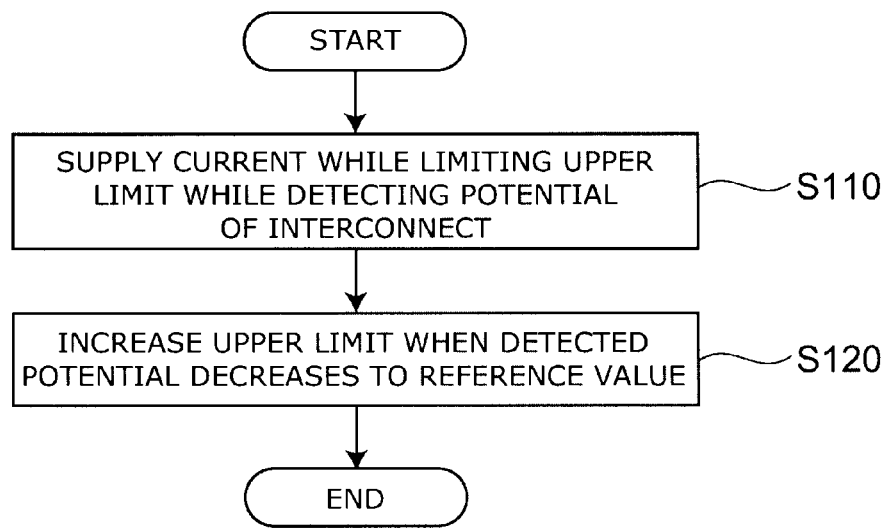
FIG. 1 is a flowchart illustrating operations of a nonvolatile memory device according to a first embodiment.

In general, according to one embodiment, a nonvolatile memory device includes a memory unit and a control unit. The memory unit includes a first interconnect, a second interconnect, and a memory cell. The second interconnect extends in a direction non-parallel to an extension direction of the first interconnect. The memory cell includes a resistance change layer provided at an intersection between the first interconnect and the second interconnect. A resistance of the resistance change layer to change due to at least one selected from a voltage applied via the first interconnect and the second interconnect and a current flowing via the first interconnect and the second interconnect. The control unit is connected to the first interconnect and the second interconnect to supply the at least one selected from the voltage and the current to the resistance change layer. The control unit is configured to increase an upper limit of a current supplied to the first interconnect based on a change of a potential of the first interconnect when applying a set operation voltage to the first interconnect in a set operation of changing the resistance change layer from a first state with a first resistance value to a second state with a second resistance value being less than the first resistance value.

Embodiments of the invention will now be described with reference to the drawings.

The drawings are schematic or conceptual; and the relationships between the thicknesses and widths of portions, the proportional coefficients of sizes among portions, etc., are not necessarily the same as the actual values thereof. Further, the dimensions and the proportional coefficients may be illustrated differently among the drawings, even for identical portions.

In the specification and the drawings of the application, components similar to those described in regard to a drawing thereinabove are marked with like reference numerals, and a detailed description is omitted as appropriate.

First Embodiment

FIG. 1 is a flowchart illustrating operations of the nonvolatile memory device according to the first embodiment.

Figure 2A:
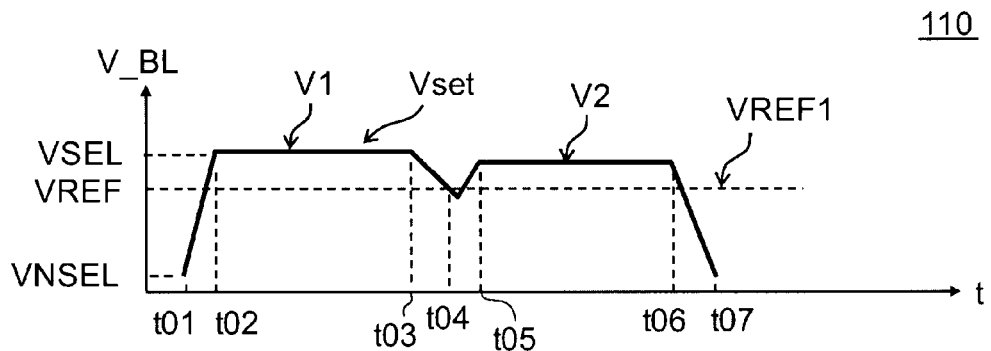
FIG. 2A and FIG. 2B are timing charts illustrating operations of the nonvolatile memory device according to the first embodiment.
Figure 2B:
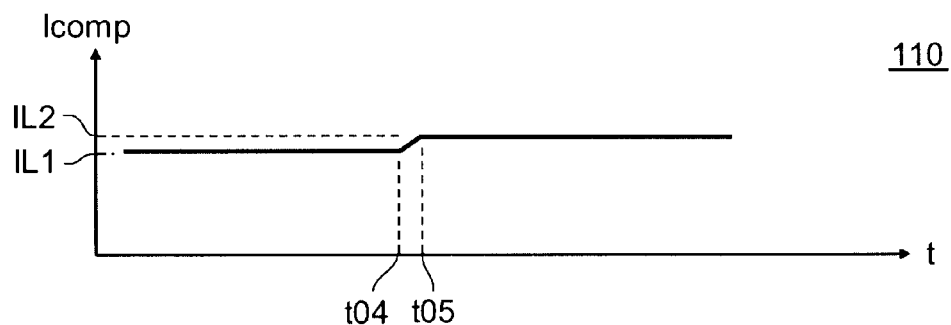

FIG. 2A and FIG. 2B are timing charts illustrating operations of the nonvolatile memory device according to the first embodiment.

Figure 3:
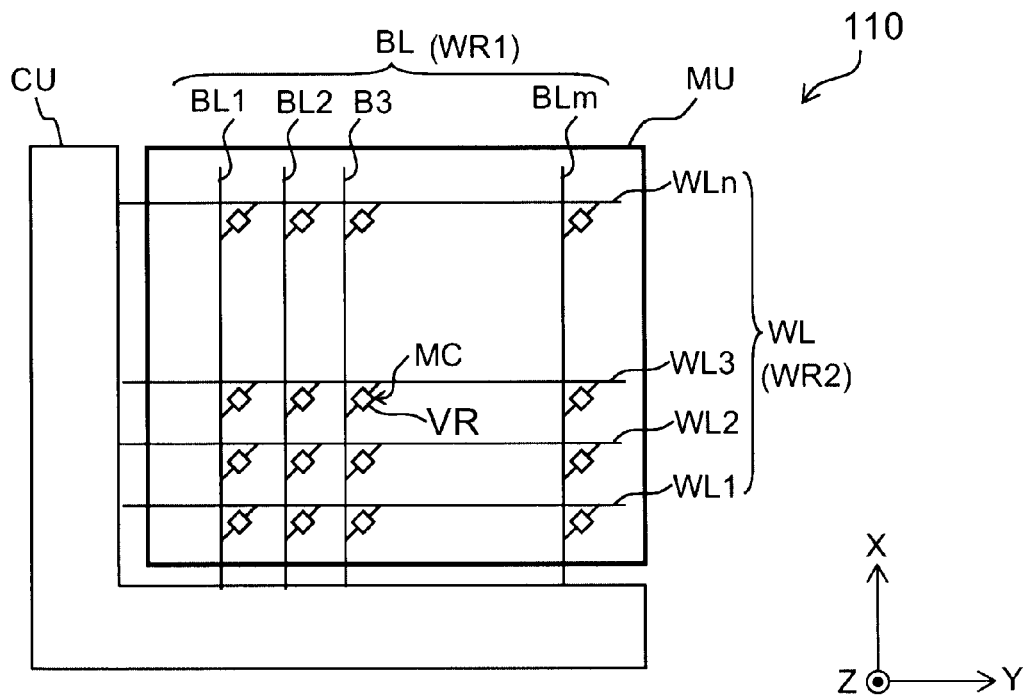
FIG. 3 is a schematic view illustrating the configuration of the nonvolatile memory device according to the first embodiment.

FIG. 3 is a schematic view illustrating the configuration of the nonvolatile memory device according to the first embodiment.

Figure 4:
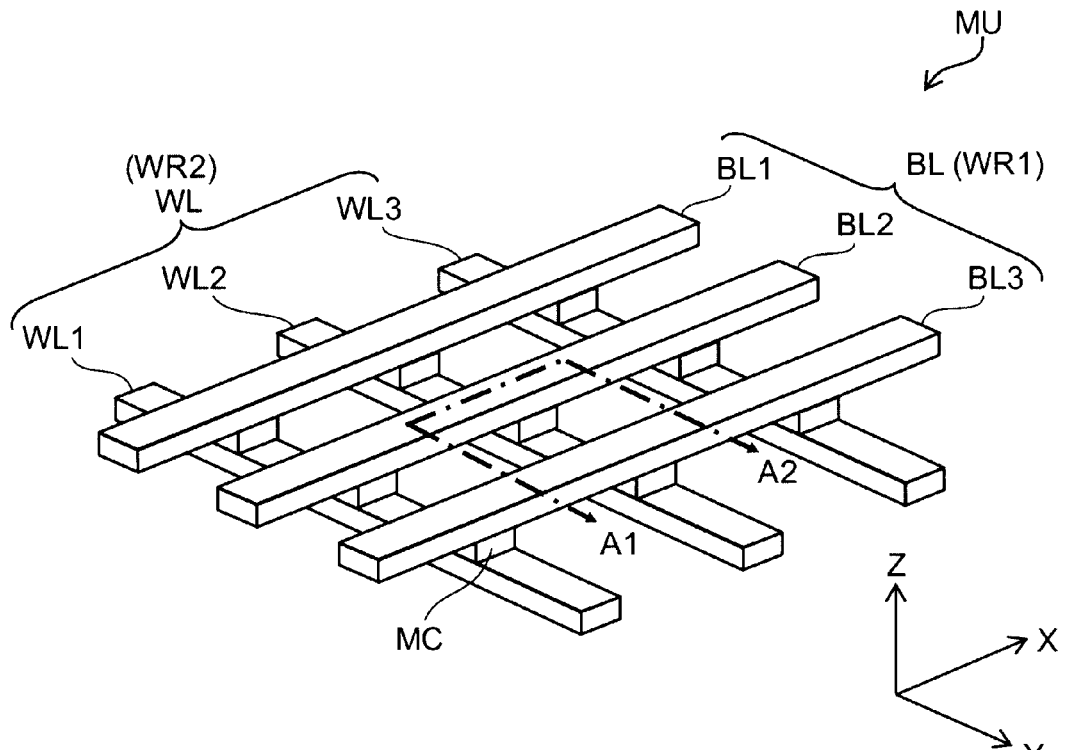
FIG. 4 is a schematic perspective view illustrating the configuration of a portion of the nonvolatile memory device according to the first embodiment.

FIG. 4 is a schematic perspective view illustrating the configuration of a portion of the nonvolatile memory device according to the first embodiment.

Figure 5:
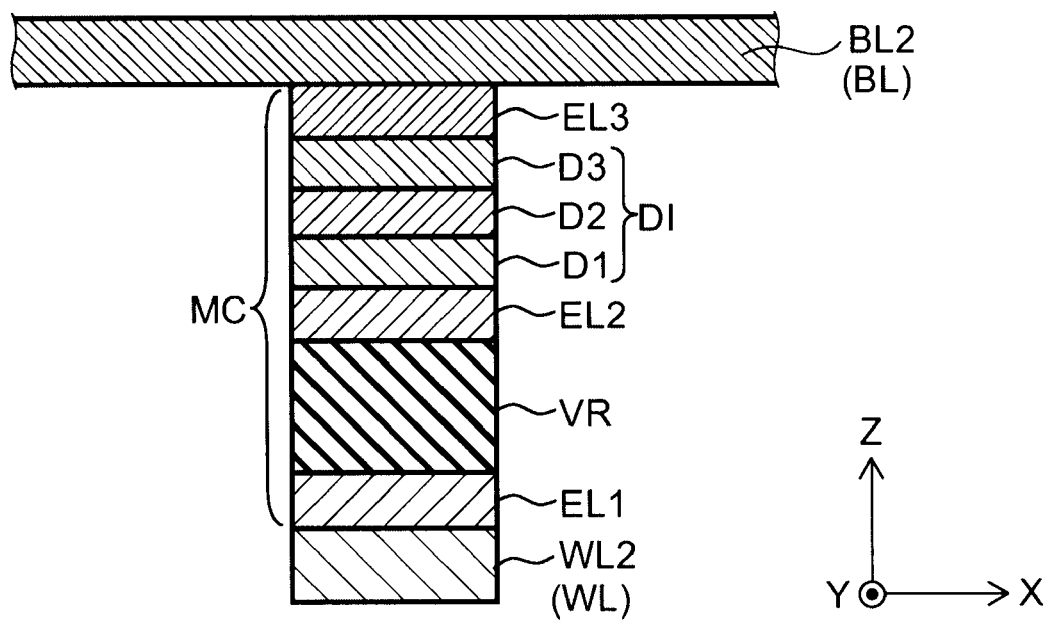
FIG. 5 is a schematic cross-sectional view illustrating the configuration of a portion of the nonvolatile memory device according to the first embodiment.

FIG. 5 is a schematic cross-sectional view illustrating the configuration of a portion of the nonvolatile memory device according to the first embodiment. Namely, FIG. 5 is a cross-sectional view along line A1-A2 of FIG. 4.

An overview of the configuration of the nonvolatile semiconductor memory device according to the embodiment will now be described with reference to FIG. 3 to FIG. 5.

As illustrated in FIG. 3, the nonvolatile memory device 110 according to this embodiment includes a memory unit MU and a control unit CU.

The memory unit MU includes a first interconnect WR1, a second interconnect WR2, and a memory cell MC.

The second interconnect WR2 extends in a direction nonparallel to the first interconnect WR1. In this specific example, the extension direction of the first interconnect WR1 and the extension direction of the second interconnect WR2 are mutually orthogonal. The first interconnect WR1 extends along, for example, an X-axis direction; and the second interconnect WR2 extends along, for example, a Y-axis direction perpendicular to the X-axis direction. A direction perpendicular to the X-axis direction and the Y-axis direction is taken as a Z-axis direction.

The first interconnect WR1 is, for example, multiply provided. In other words, each of the multiple first interconnects WR1 extends along the X-axis direction; and the multiple first interconnects WR1 are arranged along the Y-axis direction. The second interconnect WR2 is multiply provided. In other words, each of the multiple second interconnects WR2 extends along the Y-axis direction; and the multiple second interconnects WR2 are arranged along the X-axis direction.

The first interconnect WR1 may be, for example, a bit line BL. The second interconnect WR2 may be, for example, a word line WL. However, this embodiment is not limited thereto.

The first interconnect WR1 may be the word line WL; and the second interconnect WR2 may be the bit line BL. In other words, hereinbelow, the first interconnect WR1 and the second interconnect WR2 are mutually interchangeable. Hereinbelow, an example is described in which the first interconnect WR1 is the bit line BL and the second interconnect WR2 is the word line WL.

Herein, the multiple bit lines BL include, for example, first to mth bit lines BL1 to BLm (where m is an integer not less than 2). The multiple word lines WL include, for example, first to nth word lines WL1 to WLn (where n is an integer not less than 2).

It is desirable for the first interconnect WR1 and the second interconnect WR2 to include a material tolerant to heat and having a low resistance. The first interconnect WR1 and the second interconnect WR2 may include, for example, at least one selected from W, WSi, NiSi, and CoSi.

As illustrated in FIG. 3 and FIG. 4, the memory cell MC is provided at the intersection between the first interconnect WR1 and the second interconnect WR2. In other words, the multiple memory cells MC are provided at the intersections between the multiple first interconnects WR1 and the multiple second interconnects WR2, respectively. Specifically, the multiple memory cells MC are provided between the multiple first interconnects WR1 and the multiple second interconnects WR2, respectively. For example, the first interconnect WR1, the memory cell MC, and the second interconnect WR2 are stacked along the Z-axis direction.

In specification of the application, "stacking" includes the case of being overlaid with other components interposed therebetween as well as the case of being directly overlaid.

Although three bit lines BL (e.g., the first interconnects WR1) and three word lines WL (e.g., the second interconnects WR2) are illustrated for simplification in FIG. 3, the numbers of bit lines BL and word lines WL are arbitrary as described above.

As illustrated in FIG. 5, the memory cell MC includes a resistance change layer VR. In other words, each of the multiple memory cells MC includes the resistance change layer VR. A resistance of the resistance change layer VR changes due to at least one selected from a voltage applied via the first interconnect WR1 and the second interconnect WR2 and a current flowing via the first interconnect WR1 and the second interconnect WR2. In other words, the resistance of the resistance change layer VR changes based on at least one selected from a voltage applied via the first interconnect WR1 and the second interconnect WR2 and a current flowing via the first interconnect WR1 and the second interconnect WR2.

The memory cell MC may further include a first electrode EL1, a second electrode EL2, and a third electrode EL3. In this specific example, the first electrode EL1 may be electrically connected to, for example, the word line WL; the third electrode EL3 may be electrically connected to, for example, the bit line BL; and the second electrode EL2 may be provided between the first electrode EL1 and the third electrode EL3. For example, the resistance change layer VR may be provided between the first electrode EL1 and the second electrode EL2. The first electrode EL1 and the second electrode EL2 can function as, for example, a barrier metal and a bonding layer.

The memory cell MC further includes a rectifying element DI provided, for example, between the second electrode EL2 and the third electrode EL3. In this specific example, the rectifying element DI includes a first semiconductor layer D1 disposed on the second electrode EL2 side (the word line WL side), a third semiconductor layer D3 disposed on the third electrode EL3 side (the bit line BL side), and a second semiconductor layer D2 disposed between the first semiconductor layer D1 and the third semiconductor layer D3. For example, the first semiconductor layer D1 is an n-type semiconductor layer (an $n^+$ layer) having a high impurity concentration; the second semiconductor layer D2 is an n-type semiconductor layer (an $n^-$ layer) having an impurity concentration lower than that of the first semiconductor layer D1; and the third semiconductor layer D3 is a p-type semiconductor layer (a $p^+$ layer) having a high impurity concentration. Thus, although the rectifying element DI includes a pn junction diode in this specific example, any configuration such as a Schottky diode is applicable in the rectifying element DI.

Thus, the memory cell MC may include the resistance change layer VR and the rectifying element DI connected to each other in series. Although the resistance change layer VR is provided on the word line WL side and the rectifying element DI is provided on the bit line BL side in this specific example, the resistance change layer VR may be provided on the bit line BL side and the rectifying element DI may be provided on the word line WL side. Although the first semiconductor layer D1 is disposed on the word line WL side and the third semiconductor layer D3 is disposed on the bit line BL side in this specific example, the third semiconductor layer D3 may be disposed on the word line WL side and the first semiconductor layer D1 may be disposed on the bit line BL side. Hereinbelow, the case is described where the first semiconductor layer D1 is disposed on the word line WL side and the third semiconductor layer D3 is disposed on the bit line BL side.

The second electrode EL2 may include, for example, W, WN, TaN, TaSiN, $TaSi_2$, TiN, TiC, TaC, Nb—$TiO_2$, and the like considering the work function.

The first electrode EL1 and the third electrode EL3 may include, for example, Pt, Au, Ag, TiAlN, SrRuO, Ru, RuN, Ir, Co, Ti, TiN, TaN, LaNiO, Al, $PtIrO_x$, $PtRhO_x$, W, Rh/TaAlN, and the like. Further, the first electrode EU and the third electrode EL3 also may include the same material as the material of the second electrode EL2.

The memory cell MC may further include, for example, a metal film to provide the resistance change layer VR with a uniform orientation. The memory cell MC may further include buffer layers, barrier metal layers, bonding layers, etc., other than those recited above.

The first to third electrodes EU to EL3 recited above may be provided as necessary and may be omitted in some cases.

The resistance value of the resistance change layer VR changes, for example, by applying a voltage and by at least one selected from electrical current energy, thermal energy, and chemical energy. In other words, the resistance change layer VR has a first state (a high resistance state) having a first resistance value and a second state (a low resistance state) having a second resistance value less than the first resistance value. Herein, the operation of transitioning from the first state (the high resistance state) to the second state (the low resistance state) is referred to as the set operation; and the operation of transitioning from the second state (the low resistance state) to the first state (the high resistance state) is referred to as the reset operation.

An example of the configuration of the resistance change layer VR will be described below.

Although not illustrated in FIG. 4 and FIG. 5, an inter-layer insulating film is provided between the bit lines BL, between the word lines WL, and between the memory cells MC.

As illustrated in FIG. 3, a control unit CU is connected to the first interconnect WR1 and the second interconnect WR2. The control unit CU controls a voltage applied to the first interconnect WR1 and the second interconnect WR2. The control unit CU supplies to the resistance change layer VR the at least one selected from the voltage and the current for the resistance change recited above.

In the nonvolatile memory device 110 according to this embodiment, the control unit CU increases the upper limit of the current supplied to the first interconnect WR1 based on a change of the potential of the first interconnect WR1 when applying a set operation voltage to the first interconnect WR1 in a set operation of changing the resistance change layer VR from the first state having the first resistance value to the second state having the second resistance value less than the first resistance value.

Although the first interconnect WR1 may be the word line WL as described above, hereinbelow, the case is described where the first interconnect WR1 is the bit line BL. In other words, the control unit CU in the set operation increases the upper limit of the current supplied to the bit line BL based on the change of the potential of the bit line BL when applying the set operation voltage to the bit line BL.

For example, as illustrated in FIG. 1, the control unit CU supplies a current to the bit line BL (the first interconnect WR1) while limiting the current to a prescribed upper limit and detecting the potential of the bit line BL (the first interconnect WR1) (step S110).

Then, the control unit CU increases the upper limit of the current when the absolute value of the detected potential decreases to a predetermined reference value (for example, a first reference value) (step S120).

FIG. 2A illustrates the change of the potential (a bit line potential V_BL) of the detected bit line BL; and FIG. 2B illustrates the change of the upper limit (a current upper limit Icomp) of the current supplied to the bit line BL. The horizontal axes of these drawings are a time t; the vertical axis of FIG. 2A is the bit line potential V_BL; and the vertical axis of FIG. 2B is the current upper limit Icomp. In these drawings, a second time t02 is a time after a first time t01; a third time t03 is a time after the second time t02; a fourth time t04 is a time after the third time t03; a fifth time t05 is a time after the fourth time t04; a sixth time t06 is a time after the fifth time t05; and a seventh time t07 is a time after the sixth time t06.

The control unit CU performs the detection of the bit line potential V_BL and the setting of the current upper limit Icomp. Hereinbelow, to simplify the description, the voltage drop due to the resistance of the interconnects such as the bit line BL and the word line WL is ignored in the description.

Prior to the first time t01, the resistance change layer VR is taken to be in the first state of the high resistance state.

As illustrated in FIG. 2A, for example, the bit line BL is set to an unselected voltage VNSEL prior to the first time t01; and the bit line potential V_BL is the unselected voltage VNSEL. At the first time t01, a set voltage Vset having a selected voltage VSEL is applied to the bit line BL. The selected voltage VSEL corresponds to the set operation voltage.

In this specific example, the case is described where the selected voltage VSEL is a voltage having a positive polarity with respect to the reference potential; and the unselected voltage VNSEL also is a voltage having a positive polarity with respect to the reference potential. The unselected voltage VNSEL has the same potential as the reference potential. The selected voltage VSEL is a voltage higher than the unselected voltage VNSEL. In other words, the absolute value of the selected voltage VSEL is greater than the absolute value of the unselected voltage VNSEL.

Thus, by applying the set voltage Vset having the selected voltage VSEL to the bit line BL at the first time t01, the bit line potential V_BL increases from the unselected voltage VNSEL; and the bit line potential V_BL reaches the selected voltage VSEL at the second time t02. In this specific example, the selected voltage VSEL is a first voltage V1.

As illustrated in FIG. 2B, the current upper limit Icomp is set to a first value IL1 prior to the first time t01, at the first time t01, and after the first time t01. In other words, the set voltage Vset having the selected voltage VSEL is applied to the bit line BL; and a current is supplied to the bit line BL in a state in which the current is limited to the current upper limit Icomp. Then, the current flows in the resistance change layer VR. Then, the bit line potential V_BL is detected simultaneously with the supplying of the current.

Then, for example, the resistance of the resistance change layer VR changes from the first state (the high resistance state) toward the second state (the low resistance state) due to the flow of the current.

In other words, as illustrated in FIG. 2A, the resistance of the resistance change layer VR decreases at the third time t03. At this time, because the current flowing in the bit line BL is limited to the current upper limit Icomp, the bit line potential V_BL decreases as the resistance of the resistance change layer VR decreases.

The decrease of the bit line potential V_BL is detected; and the detected bit line potential V_BL (the absolute value thereof) decreases to a predetermined reference value VREF (e.g., a first reference value VREF1) at the fourth time t04.

At this time, as illustrated in FIG. 2B, the control unit CU increases the current upper limit Icomp when the detected bit line potential V_BL (the absolute value thereof) decreases to the predetermined reference value VREF (e.g., the first reference value VREF1) (the fourth time t04). In this specific example, the control unit CU increases the current upper limit Icomp from the first value IL1 toward a second value IL2 greater than the first value IL1. In this specific example, the current upper limit Icomp is increased from the fourth time t04; and the current upper limit Icomp reaches the second value IL2 at the fifth time t05.

Thereby, the bit line potential V_BL increases from the fourth time t04 to reach a constant value (in this example, a second voltage V2) at, for example, the fifth time t05. The second voltage V2 may be the same as the first voltage V1 or different from the first voltage V1. In the case where the current flowing in the bit line BL is limited to the second value IL2, the second voltage V2 has a lower value than the first voltage V1.

As illustrated in FIG. 2A, in the case where the change of the resistance value of the resistance change layer VR is exceedingly rapid, the bit line potential V_BL may reach a value less than the reference value VREF (e.g., the first reference value VREF1) in the extremely short interval from the fourth time t04 to the fifth time t05. Then, the bit line potential V_BL increases from this value.

Then, a current is supplied to the bit line BL in the state in which the current upper limit Icomp is increased to the second value IL2; and, for example, at the sixth time t06 after a predetermined amount of time, an end operation of the supply of the current to the bit line BL is implemented. In other words, at the sixth time t06, the set voltage Vset is set to, for example, the unselected voltage VNSEL; and the bit line potential V_BL returns to the unselected voltage VNSEL at the seventh time t07 after a slight time delay.

Thus, in the nonvolatile memory device 110 according to this embodiment, a first current supply is implemented in which the current upper limit Icomp is set to the first value IL1 (step S110); and a second current supply is implemented in which the current upper limit Icomp is increased to the second value IL2 when the bit line potential V_BL decreases to the reference value VREF (step S120). Thereby, the controllability of the set operation can be increased.

Figure 6:
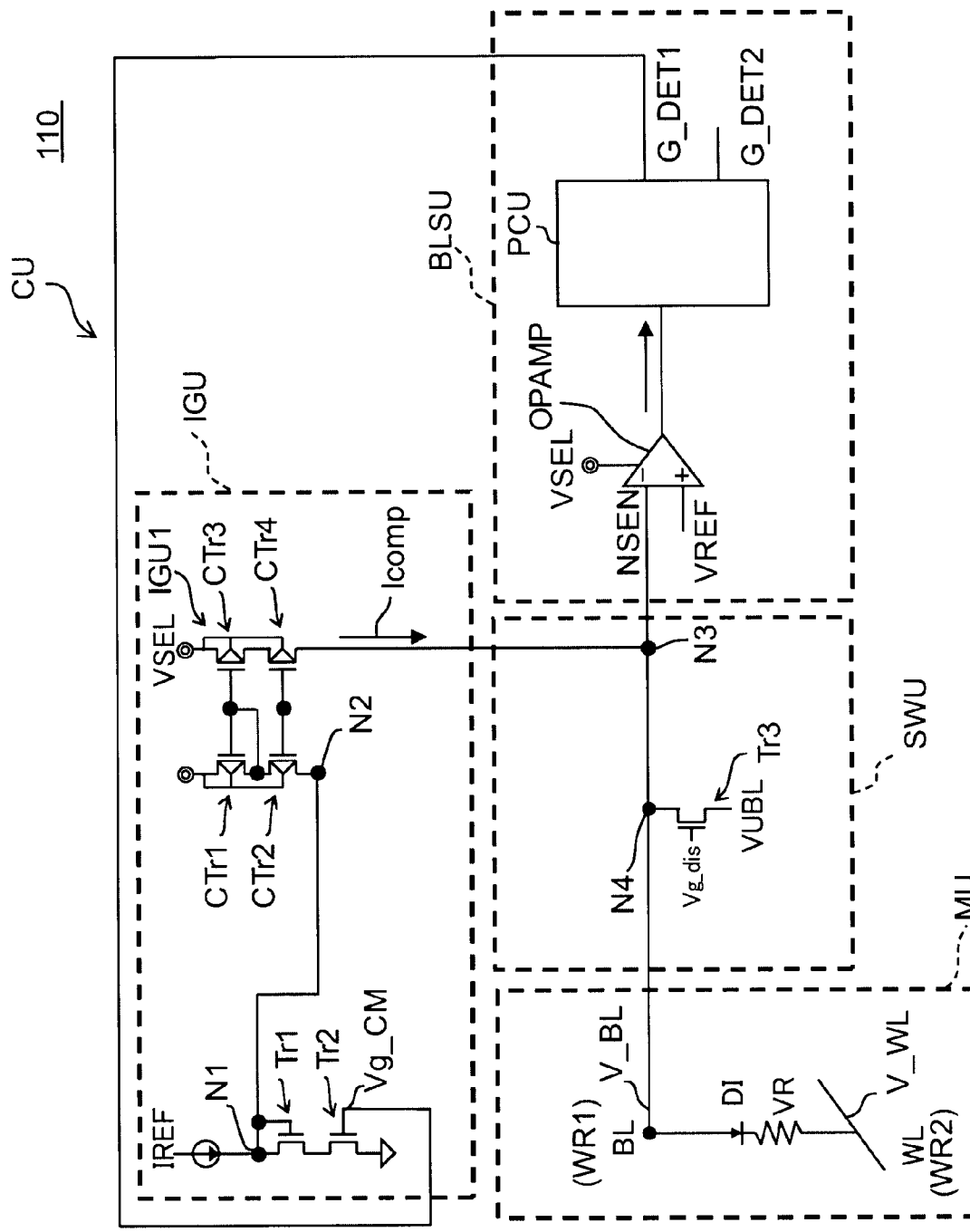
FIG. 6 is a circuit diagram illustrating the configuration of the nonvolatile memory device according to the first embodiment.

FIG. 6 is a circuit diagram illustrating the configuration of the nonvolatile memory device according to the first embodiment.

Namely, FIG. 6 illustrates the configuration of a circuit included in the nonvolatile memory device 110.

As illustrated in FIG. 6, the control unit CU includes, for example, a current generation unit IGU, a bit line potential detection unit BLSU (a detection unit), and a switch unit SWU.

The current generation unit IGU includes, for example, a current mirror circuit IGU1, a current source IREF, a first transistor Tr1, and a second transistor Tr2.

The first transistor Tr1 and the second transistor Tr2 are connected in series; and one terminal of the current path of the first transistor Tr1 is connected to the current source IREF at a first node N1. A terminal of the current path of the second transistor Tr2 on the side opposite to the first transistor Tr1 is set to, for example, a low potential.

The current mirror circuit IGU1 includes first to fourth current mirror transistors CTr1 to CTr4. The first current mirror transistor CTr1 and the second current mirror transistor CTr2 are connected in series. The third current mirror transistor CTr3 and the fourth current mirror transistor CTr4 are connected in series. In the current mirror circuit IGU1, a current flows in the current path of the third current mirror transistor CTr3 and the fourth current mirror transistor CTr4 corresponding to the current flowing in the current path of the first current mirror transistor CTr1 and the second current mirror transistor CTr2. The current path of the fourth current mirror transistor CTr4 on the side opposite to the third current mirror transistor CTr3 is the output of the current mirror circuit IGU1.

One terminal of the current path of the second current mirror transistor CTr2 of the current mirror circuit IGU1 is connected to a second node N2 which is connected to the first node N1.

The selected voltage VSEL is applied to one terminal of the third current mirror transistor CTr3 of the current mirror circuit IGU1. The current mirror ratio of the current mirror circuit IGU1 is controlled by the operation of the second transistor Tr2.

The output of the current generation unit IGU (the output of the current mirror circuit IGU1) is connected to the bit line BL via the switch unit SWU.

The output line of the current generation unit IGU (the output line of the current mirror circuit IGU1) is connected to a third node N3 of the switch unit SWU; and the output line of the current generation unit IGU (the output line of the current mirror circuit IGU1) is electrically connected to the bit line BL. The potential of the bit line BL is the bit line potential V_BL. A word line signal V_WL is input to the word line WL.

The switch unit SWU includes, for example, a third transistor Tr3. One terminal of the current path of the third transistor Tr3 is connected to a fourth node N4 between the third node N3 and the bit line BL. A voltage VUBL is applied to the terminal of the current path of the third transistor Tr3 on the side opposite to the fourth node N4. A discharge signal Vg_dis is input to the gate of the third transistor Tr3.

The bit line potential detection unit BLSU includes, for example, a comparison circuit OPAMP and a pulse control circuit PCU. One terminal of the comparison circuit OPAMP is electrically connected to the third node N3; and a signal NSEN reflecting the potential of the bit line BL is input to one other terminal of the comparison circuit OPAMP. Still one other terminal of the comparison circuit OPAMP is set to the reference value VREF (e.g., the first reference value VREF1). The output of the comparison circuit OPAMP is input to the pulse control circuit PCU. A signal based on a first detection signal G_DET1 which is the output of the pulse control circuit PCU is input to the gate of the second transistor Tr2. It is desirable for the first detection signal G_DET1 to be input to the gate of the second transistor Tr2 via, for example, a peak hold circuit (not illustrated). Herein, the signal based on the first detection signal G_DET1 input to the gate of the second transistor Tr2 is a current control signal Vg_CM.

Thus, in the control unit CU, the current control signal Vg_CM reflecting the first detection signal G_DET1 based on the detection result of the bit line potential V_BL from the bit line potential detection unit BLSU is input to the gate of the second transistor Tr2 of the current generation unit IGU. Thereby, the current mirror ratio of the current mirror circuit IGU1 is controlled; and as a result, the current upper limit Icomp of the current supplied from the current generation unit IGU to the bit line BL is controlled. In other words, the operations described in regard to FIG. 1 and FIGS. 2A and 2B are implemented by the control unit CU.

FIG. 7A to FIG. 7E are timing charts illustrating operations of the nonvolatile memory device according to the first embodiment.

Namely, these drawings illustrate the relationship of the potentials of the set operation of the components included in the control unit CU illustrated in FIG. 6. The horizontal axis of these drawings is the time t.

Figure 7A:
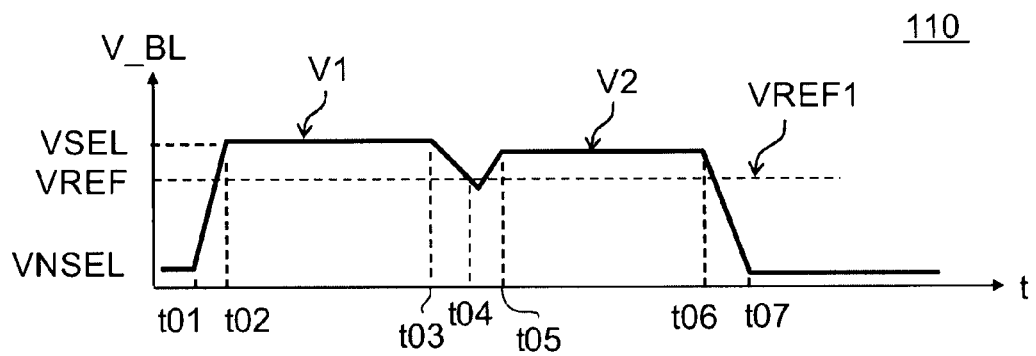
FIG. 7A to FIG. 7E are timing charts illustrating operations of the nonvolatile memory device according to the first embodiment.
Figure 7B:
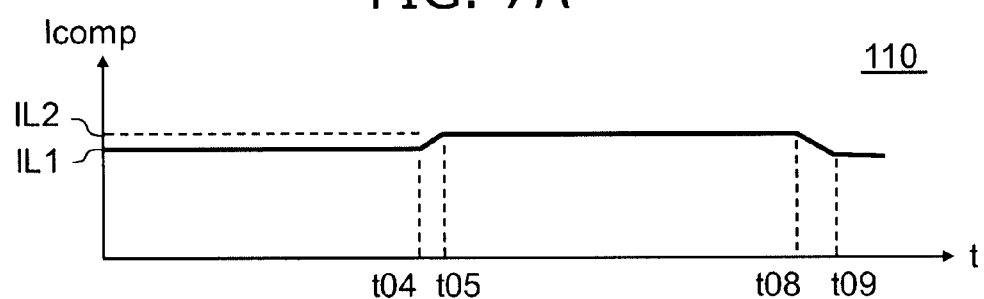
Figure 7C:
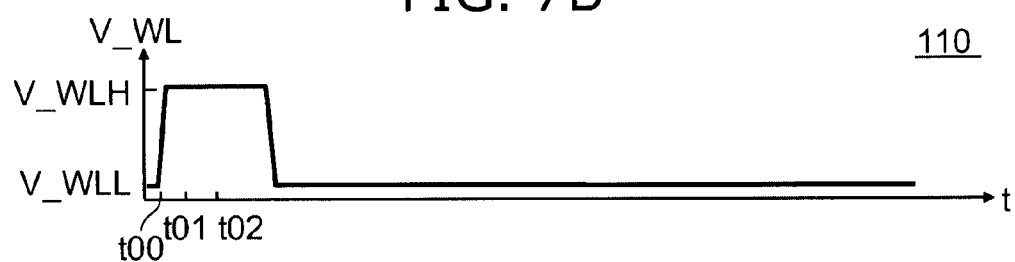
Figure 7D:
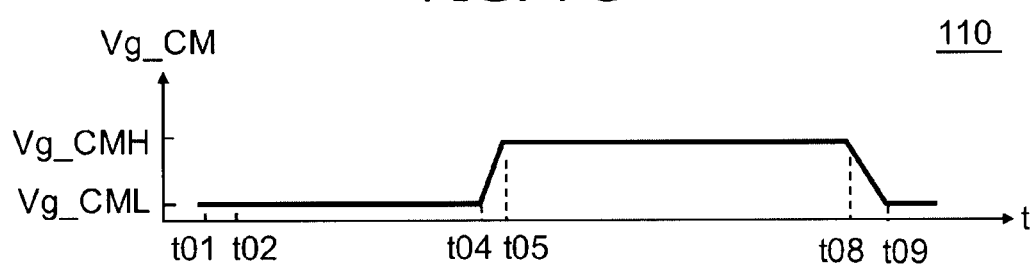
Figure 7E:
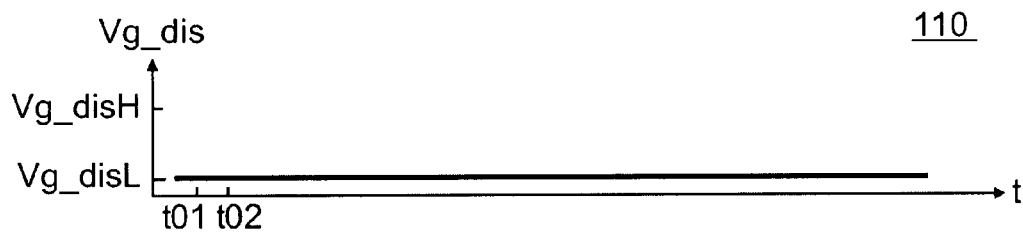

The vertical axis of FIG. 7A is the bit line potential V_BL; the vertical axis of FIG. 7B is the current upper limit Icomp; the vertical axis of FIG. 7C is the word line signal V_WL; the vertical axis of FIG. 7D is the current control signal Vg_CM; and the vertical axis of FIG. 7E is the discharge signal Vg_dis.

As illustrated in FIG. 7C, the word line signal V_WL is set to a low voltage V_WLL prior to a time t00 which is prior to the first time t01. At the time t00, the word line signal V_WL changes from the low voltage V_WLL toward a high voltage V_WLH. The word line signal V_WL reaches the high voltage V_WLH prior to the first time t01 and is maintained at the high voltage V_WLH. The word line signal V_WL returns to the low voltage V_WLL after the second time t02 and prior to the third time t03.

As illustrated in FIG. 7D, the current control signal Vg_CM is set to a low voltage Vg_CML at the first time t01. On the other hand, in this specific example, the discharge signal Vg_dis is constantly set to a low voltage Vg_disL as illustrated in FIG. 7E.

As illustrated in FIG. 7A, the set voltage Vset having the selected voltage VSEL is applied to the bit line BL at the first time t01; the bit line potential V_BL increases from the unselected voltage VNSEL; and the bit line potential V_BL reaches the selected voltage VSEL at the second time t02. In this specific example, the selected voltage VSEL is the first voltage V1. A voltage of, for example, not less than 5.5 volts (V) and not more than 6.0 V may be used as the selected voltage VSEL (the first voltage V1).

As illustrated in FIG. 7B, a current flows in the resistance change layer VR in the state in which the current upper limit Icomp is set to the first value IL1. The resistance of the resistance change layer VR decreases from the first state (the high resistance state) toward the second state (the low resistance state) due to the flow of the current; and the bit line potential V_BL starts to decrease at the third time t03 as the resistance of the resistance change layer VR decreases as illustrated in FIG. 7A.

The decrease of the bit line potential V_BL is detected by the comparison circuit OPAMP; and the bit line potential V_BL (the absolute value thereof) decreases to the predetermined reference value VREF (e.g., the first reference value VREF1) at the fourth time t04. About 5 V, for example, may be used as the reference value VREF.

Thereby, as illustrated in FIG. 7D, the current control signal Vg_CM changes from the low voltage Vg_CML toward a high voltage Vg_CMH at the fourth time t04.

Thereby, the current upper limit Icomp increases as illustrated in FIG. 7B. In this specific example, the current upper limit Icomp increases from the first value IL1 toward the second value IL2 which is greater than the first value IL1.

Thereby, as illustrated in FIG. 7A, the bit line potential V_BL increases from the fourth time t04 to reach the second voltage V2 at, for example, the fifth time t05. The second voltage V2 may be the same as the first voltage V1 or different from the first voltage V1.

Then, a current is supplied to the bit line BL in the state in which the current upper limit Icomp is increased to the second value IL2; and an end operation of the supply of the current to the bit line BL is implemented, for example, at the sixth time t06 after a predetermined amount of time. In other words, the set voltage is set to, for example, the unselected voltage VNSEL at the sixth time t06; and the bit line potential V_BL returns to the unselected voltage VNSEL at the seventh time t07 after a slight time delay.

Subsequently, the current control signal Vg_CM starts to change from the high voltage Vg_CMH toward the low voltage Vg_CML at an eighth time t08 and reaches the low voltage Vg_CML at a ninth time t09. Thereby, the current upper limit Icomp starts to change from the second value IL2 toward the first value IL1 and returns to the initial first value IL1 at the ninth time t09.

Thus, by the circuit configuration illustrated in FIG. 6, the upper limit of the current (the current upper limit Icomp) supplied to the bit line BL is increased based on the change of the potential of the bit line BL (the bit line potential V_BL). Thereby, the controllability of the set operation can be increased.

In other words, in the nonvolatile memory device 110, the second current supply, in which the current upper limit Icomp is increased to the second value IL2, is performed after the first current supply, in which the current upper limit Icomp is set to the first value IL1. In other words, in the set operation, the bit line potential V_BL starts to increase from the first time t01, is substantially constant from the second time t02 to the third time t03, decreases from the third time t03, once again increases from the fourth time t04, is substantially constant from the fifth time t05 to the sixth time t06, starts to decrease from the sixth time t06, and finishes decreasing at the seventh time t07. In other words, the waveform of the bit line potential V_BL includes a first pulse from the first time t01 to the fourth time t04 and a second pulse from the fourth time t04 to the seventh time t07. The first pulse and the second pulse are continuous.

Thus, a stable low resistance state can be realized by implementing the first current supply and the second current supply in combination. For example, an unstable low resistance state can be changed to a stable low resistance state. Also, for example, it is conceivable to screen unstable low resistance states and leave only stable low resistance states.

Figure 8:
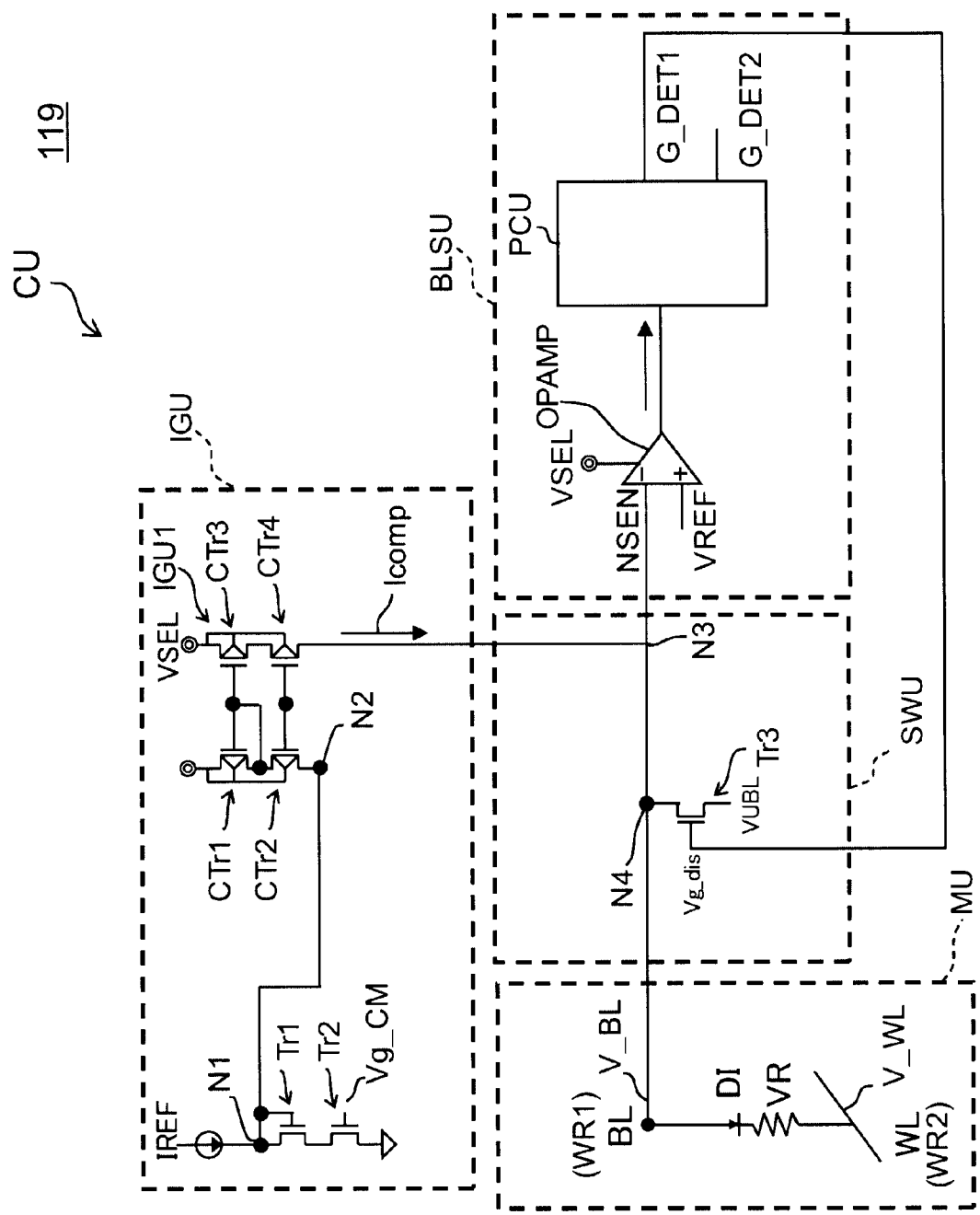
FIG. 8 is a circuit diagram illustrating the configuration of a nonvolatile memory device of a comparative example.

FIG. 8 is a circuit diagram illustrating the configuration of a nonvolatile memory device of a comparative example.

Namely, the configuration of a circuit included in the nonvolatile memory device 119 of the comparative example is illustrated.

In the comparative example as illustrated in FIG. 8, the first detection signal G_DET1 based on the detection result of the potential of the bit line BL from the bit line potential detection unit BLSU is not input to the gate of the second transistor Tr2 of the current generation unit IGU. The first detection signal G_DET1 is input as the discharge signal Vg_dis to the gate of the third transistor Tr3 of the switch unit SWU.

FIG. 9A to FIG. 9E are timing charts illustrating operations of the nonvolatile memory device of the comparative example.

Namely, these drawings illustrate the relationship of the potentials of the set operation of the components included in the control unit CU illustrated in FIG. 8. The horizontal axes of these drawings are the time t.

Figure 9A:
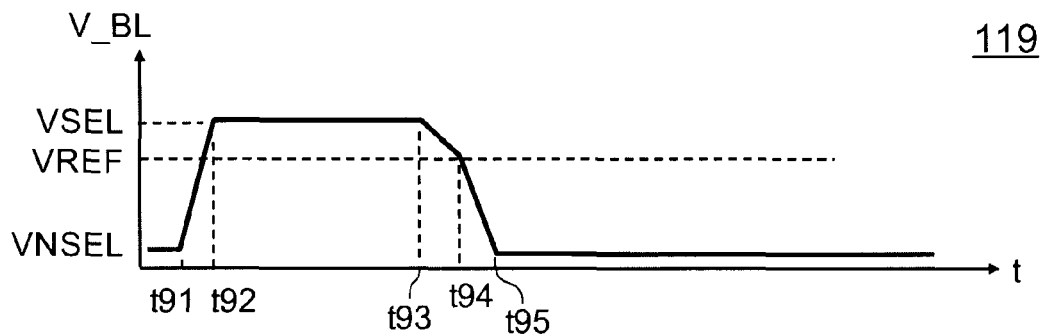
FIG. 9A to FIG. 9E are timing charts illustrating operations of the nonvolatile memory device of the comparative example.
Figure 9B:
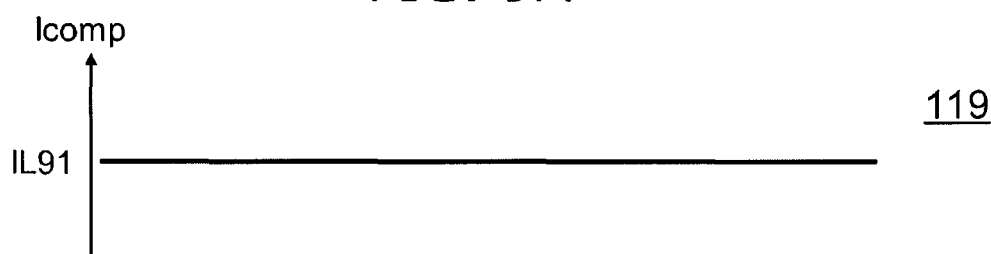
Figure 9C:
Figure 9D:
Figure 9E:
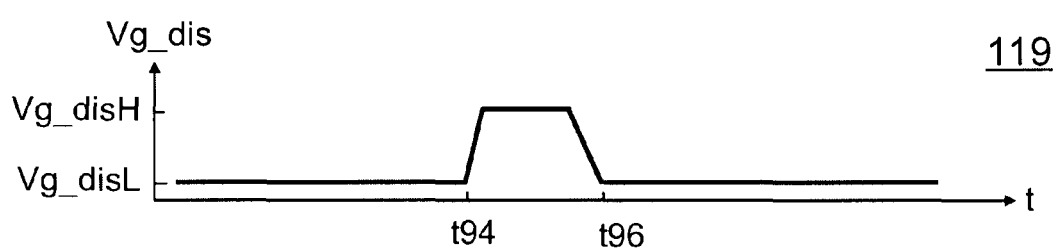

As illustrated in FIG. 9D, the current control signal Vg_CM is constant at the low voltage Vg_CML. Therefore, the current mirror ratio of the current mirror circuit IGU1 is constant.

Therefore, in the nonvolatile memory device 119 of the comparative example as illustrated in FIG. 9B, the current upper limit Icomp is constant; and the current upper limit Icomp is set to a value IL91.

As illustrated in FIG. 9C, in the nonvolatile memory device 119 as well, the word line signal V_WL changes from the low voltage V_WLL to the high voltage V_WLH at a time t90.

As illustrated in FIG. 9A, the bit line potential V_BL increases from the unselected voltage VNSEL at a first time t91; and the bit line potential V_BL reaches the selected voltage VSEL at a second time t92. Then, the bit line potential V_BL starts to decrease at a third time t93 based on the decrease of the resistance of the resistance change layer VR.

The decrease of the bit line potential V_BL is detected by the comparison circuit OPAMP; and the bit line potential V_BL decreases to the reference value VREF at a fourth time t94.

As illustrated in FIG. 9D, the discharge signal Vg_dis changes from the low voltage Vg_disL to a high voltage Vg_disH at the fourth time t94 based on the decrease of the bit line potential V_BL. Thereby, the current supplied from the current generation unit IGU flows through the third transistor Tr3 and is not supplied to the bit line BL. Then, for example, the charge of the bit line BL also is discharged through the third transistor Tr3.

Therefore, as illustrated in FIG. 9A, the bit line potential V_BL decreases abruptly from the fourth time t94 and returns to the unselected voltage VNSEL at a fifth time t95.

Subsequently, the discharge signal Vg_dis returns from the high voltage Vg_disH to the low voltage Vg_disL at a sixth time t96.

In other words, in the nonvolatile memory device 119 as illustrated in FIG. 9A, the supply of the current of the set operation occurs once. In other words, in the set operation, the bit line potential V_BL starts to increase from the first time t91, is substantially constant from the second time t92 to the third time t93, starts to decrease from the third time t93, and finishes decreasing at the fifth time t95. In other words, the waveform of the bit line potential V_BL has the waveform of only one pulse from the first time t91 to the fifth time t05.

In the nonvolatile memory device 119 of the comparative example in which such operations are implemented, there are cases where the low resistance state is unstable in the set operation; and the controllability of the set operation may be low.

Conversely, in the nonvolatile memory device 110 according to this embodiment, a stable low resistance state can be realized by combining the first current supply and the second current supply in which the current upper limit Icomp is increased; and the controllability of the set operation increases.

Such a configuration to increase the controllability of the set operation by performing the first current supply and the second current supply was constructed based on experimental results such as those recited below.

Figure 10:
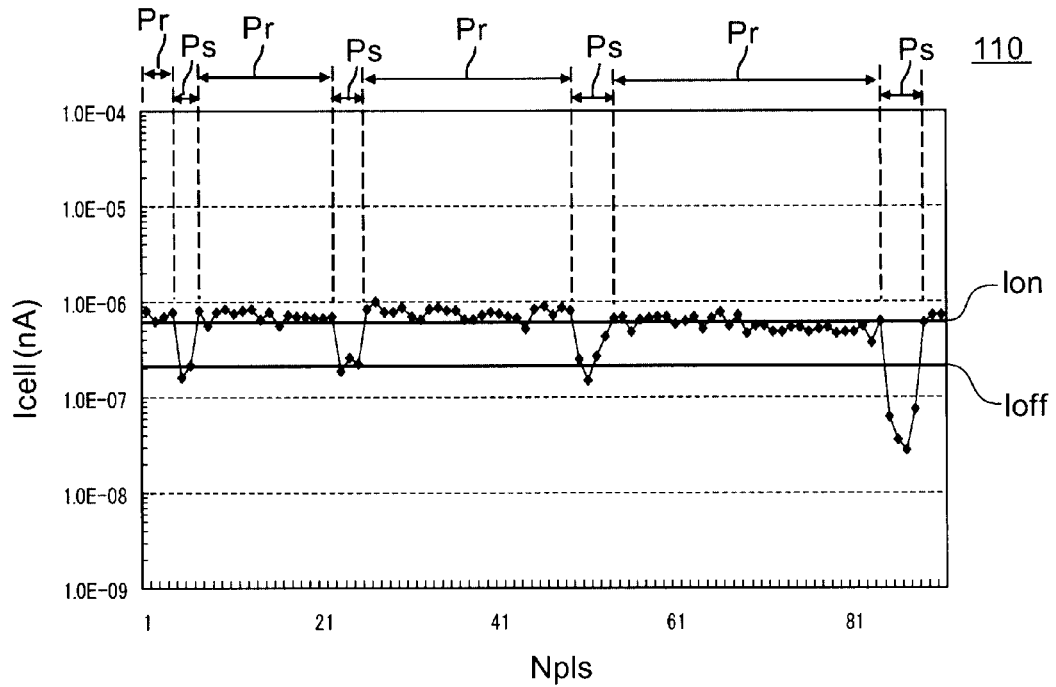
FIG. 10 is a graph illustrating experimental results relating to the nonvolatile memory device.

FIG. 10 is a graph illustrating experimental results relating to a nonvolatile memory device.

Namely, FIG. 10 illustrates measurement results of a current Icell flowing in the memory cell MC when a set operation of applying a set pulse and a reset operation of applying a reset pulse to the memory cell MC were implemented.

In this experiment, a waveform having two pulses as illustrated in FIG. 7A was used as the set pulse. In other words, as the set pulse, a first pulse having a duration from the first time t01 to the fourth time t04 of not more than 1 microsecond (μs) and a voltage of 4.5 V and a second pulse having a duration from the fourth time t04 to the seventh time t07 of 1 μs and a voltage of 3.5 V were applied continuously to the memory cell MC. Then, as the reset pulse, a pulse having a duration of 10 μs and a voltage of 4 V was used. In other words, FIG. 10 corresponds to the operations of the nonvolatile memory device 110 according to the embodiment.

The state in which the current Icell was not more than 0.2 μA was taken to be an OFF current Ioff state (the high resistance state); and the state in which the current Icell was not less than 0.6 μA was taken to be an ON current Ion state (the low resistance state). Switching was repeatedly performed alternately between the low resistance state and the high resistance state. In other words, when the current Icell was in the OFF current Ioff state, the set pulses were applied; and the set pulses were applied repeatedly until the current Icell reached the ON current Ion state. When the current Icell was in the ON current Ion state, the reset pulses were applied; and the reset pulses were applied repeatedly until the current Icell reached the OFF current Ioff state.

The horizontal axis of FIG. 10 is the number of applied pulses (a pulse number Npls).

In a set pulse application interval Ps in FIG. 10, the current Icell is in a state of being smaller than the ON current Ion; and the set pulses are applied repeatedly until reaching the state in which the current Icell is not less than the ON current Ion. In other words, the set pulse application interval Ps corresponds to the interval in which the set operation is implemented. On the other hand, a reset pulse application interval Pr is the state in which the current Icell is larger than the OFF current Ioff; and the reset pulses are applied repeatedly until reaching the state in which the current Icell is not more than the OFF current Ioff. In other words, the reset pulse application interval Pr corresponds to the interval in which the reset operation is implemented.

In this experiment, $ZnMn_2O_4$ was used as the resistance change layer VR of the memory cell MC. The thickness of the resistance change layer VR was 5 nm; and the surface area when cut by a plane perpendicular to the thickness direction of the resistance change layer VR was 50 nm×50 nm.

In the set operation as illustrated in FIG. 10, the set pulse application interval Ps was short in this experiment in which the two continuous pulse waveforms were used. In other words, the number of the applications of the set pulse (the pulse number Npls) was 2 to 4 times; and the memory cell MC transitioned to the low resistance state by a low number of applications of the set pulse (the pulse number Npls). In other words, the number of reapplications of the set pulse was low.

The current Icell was uniform in the set state (the low resistance state) and had substantially a constant value regardless of the pulse number Npls.

In the reset operation as well, the number of the applications of the reset pulse (the pulse number Npls) was 20 to 30 times; and the memory cell MC transitioned to the high resistance state by a relatively low number of applications of the reset pulse (the pulse number Npls). In other words, the number of reapplications of the reset pulse in the reset operation also was low.

Figure 11:
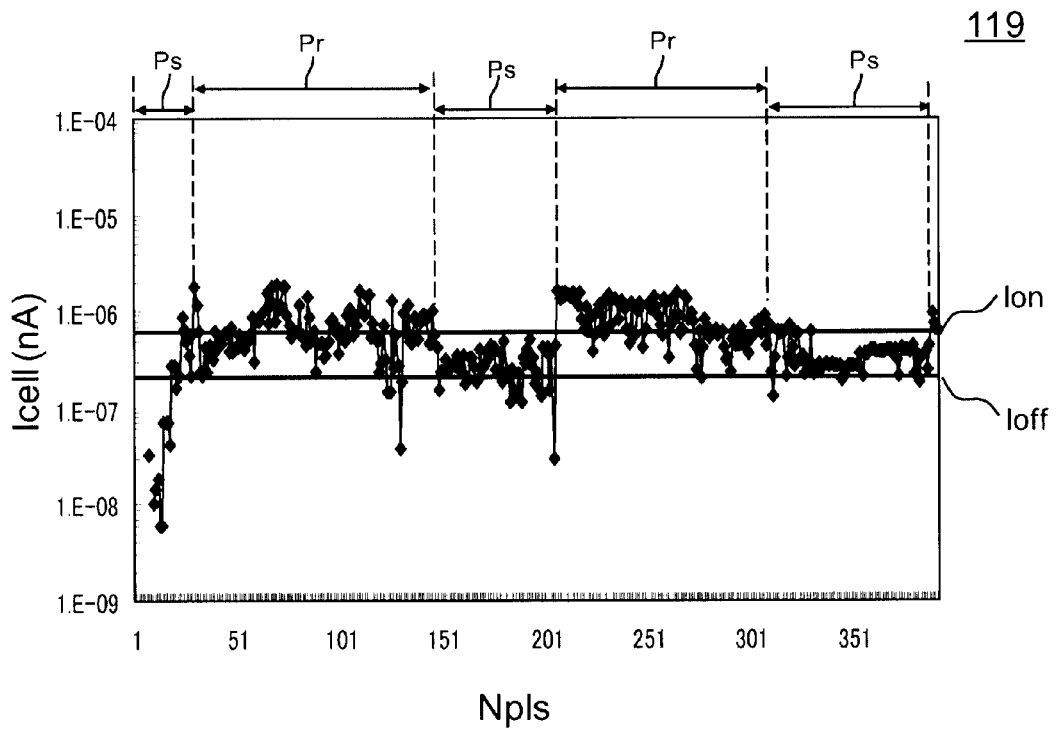
FIG. 11 is a graph illustrating another experimental result regarding the nonvolatile memory device.

FIG. 11 is a graph illustrating another experimental result regarding the nonvolatile memory device.

In this experiment, a waveform having the one pulse illustrated in FIG. 9A was used as the set pulse. In other words, one pulse having a duration from the first time t91 to the fifth time t95 of not more than 2 μs and a voltage of 4.5 V was applied to the memory cell MC as the set pulse. In other words, the experiment for which the results are illustrated in FIG. 11 corresponds to the operations of the nonvolatile memory device 119 of the comparative example. The duration of one set pulse was set to twice that of the experiment for which the results are illustrated in FIG. 10. In this experiment, the reset pulse was the same as that of the experiment for which the results are illustrated in FIG. 10.

In the set pulse application interval Ps (i.e., the set operation) in this case as well, the set pulses were applied repeatedly until the ON current Ion state was reached. In the reset pulse application interval Pr (i.e., the reset operation), the reset pulse was applied repeatedly until the OFF current Ioff state was reached. The configuration of the memory cell MC of this experiment was the same as the configuration of the memory cell MC of the experiment illustrated in FIG. 10.

In the set operation as illustrated in FIG. 11, the set pulse application interval Ps was extremely long in the experiment in which the one pulse waveform was used. In other words, in the set operation, the number of applications of the set pulse was 50 times; and the memory cell MC transitioned to the low resistance state by an extremely high number of applications of the set pulse. In other words, the number of reapplications of the set pulse in the set operation was extremely high.

Further, the current Icell in the set state (the low resistance state) was nonuniform and had large fluctuation.

In the reset operation as well, the number of applications of the reset pulse (the pulse number Npls) was about 100 times; and the memory cell MC transitioned to the high resistance state by a high number of applications of the set pulse (the pulse number Npls). In other words, the number of reapplications of the reset pulse in the reset operation also was high.

Thus, in the case where the set operation is performed by the set pulse of the one pulse waveform, the transition to the low resistance state is difficult; the current Icell in the low resistance state has large fluctuation; and the controllability of the set operation is poor. The reset operation of transitioning from the low resistance state to the high resistance state also is difficult.

Conversely, as described in regard to FIG. 10, the transition to the low resistance state is easy in the case where the set operation is performed using the two pulse waveform (the first current supply and the second current supply). Further, the current Icell in the low resistance state can be uniform. Also, the reset operation is easy.

In a separate experiment, it was found that, in the case where the transition from the high resistance state to the low resistance state is performed by applying multiple pulses to the resistance change layer VR, there exist the case of transitioning to the low resistance state from a state in which the current of the resistance change layer VR is relatively small directly prior to the transition, i.e., where the current value has one large increase, and the case of transitioning to the low resistance state from a state in which the current of the resistance change layer VR is relatively large directly prior to the transition, i.e., where the current value gradually increases due to the application of the multiple pulses. Also, it was found that the reset operation is easier in the case where the current value increases gradually (the case where the current of the resistance change layer VR directly prior to the transition is large) than in the case where the current value has one large increase (the case where the current of the resistance change layer VR directly prior to the transition is large).

The results of this separate experiment coincide with the experimental results recited above that the reset operation of FIG. 10 is easier than that of FIG. 11.

As illustrated in FIGS. 9A to 9E, in the case where the set operation is performed by the set pulse of the one pulse waveform, it is necessary to preset a high current upper limit Icomp beforehand to effectively apply the voltage to the resistance change layer VR even in the case where the resistance state is near the low resistance state; and the current upper limit Icomp may be undesirably set too high for the low resistance state. Conversely, in this embodiment, an appropriate current upper limit Icomp can be used because the set operation is performed by the set pulse of the two pulse waveforms; and an excessive setting can be suppressed.

Thus, the controllability of the operations, including the set operation and the reset operation, can be increased by performing the set operation using the two pulse waveforms (the first current supply and the second current supply).

In the nonvolatile memory device 110 according to this embodiment, the control unit CU detects the bit line potential V_BL when applying the set operation voltage to the bit line BL and increases the current upper limit Icomp supplied to the bit line BL based on the change of the bit line potential V_BL. In other words, the first current supply in which the current upper limit Icomp is limited to a relatively small first value IL1 and the second current supply in which the current upper limit Icomp is limited to a relatively large second value IL2 are performed continuously.

On the other hand, it is conceivable to perform the first current supply in which the current upper limit Icomp is limited to the relatively small first value IL1, subsequently perform a verify operation to detect the state of the memory cell MC, and subsequently perform the second current supply in which the current upper limit Icomp is limited to the relatively large second value IL2 based on the result of the verify operation. However, in such a case, the time of one set operation lengthens because the verify operation is performed between the first current supply and the second current supply.

Conversely, this embodiment provides the advantage that the time of one set operation can be shortened because the first current supply, in which a current is supplied to the bit line BL while the current flowing in the bit line BL is limited to the current upper limit Icomp (the first value IL1) while the bit line potential V_BL is detected, and the second current supply, in which the current upper limit Icomp is increased when the absolute value of the detected bit line potential V_BL decreases to the predetermined reference value VREF (the first reference value VREF1), are performed continuously.

It is desirable for the absolute value of the set operation voltage (the second voltage V2 illustrated in FIG. 1) applied to the bit line BL in the second current supply (the supply of the current in which the current is limited to the current upper limit Icomp of the second value IL2) to be less than the absolute value of the set operation voltage (the selected voltage VSEL, i.e., the first voltage V1 illustrated in FIG. 1) applied to the bit line BL in the first current supply (the supply of the current in which the current is limited to the current upper limit Icomp of the first value IL1). In the case where the current flowing in the bit line BL is limited to the second value IL2, the second voltage V2 has a value less than the first voltage V1. Further, it is possible for the second voltage V2 to be lower than the first voltage V1 by reducing the selected voltage VSEL.

In other words, the application of an excessively large voltage to the memory cell MC can be suppressed by reducing the value of the set voltage from the first voltage V1 to the second voltage V2. In other words, a low stress applied to the memory cell MC can be maintained. Thereby, for example, the reliability of the nonvolatile memory device can be increased.

In other words, the control unit CU can reduce the absolute value of a set operation voltage V (the selected voltage VSEL) based on the change of the potential of the bit line BL (the bit line potential V_BL).

In this embodiment, similar effects can be obtained also by, for example, using a capacitor and by using an operation of applying a voltage to the bit line BL by supplying a charge stored in the capacitor to the bit line BL.

Second Embodiment

A nonvolatile memory device 120 according to a second embodiment also includes the memory unit MU and the control unit CU. The configuration of the memory unit MU can be similar to that of the nonvolatile memory device 110, and a description is therefore omitted. The control unit CU of the nonvolatile memory device 120 and operations thereof will now be described.

Figure 12:
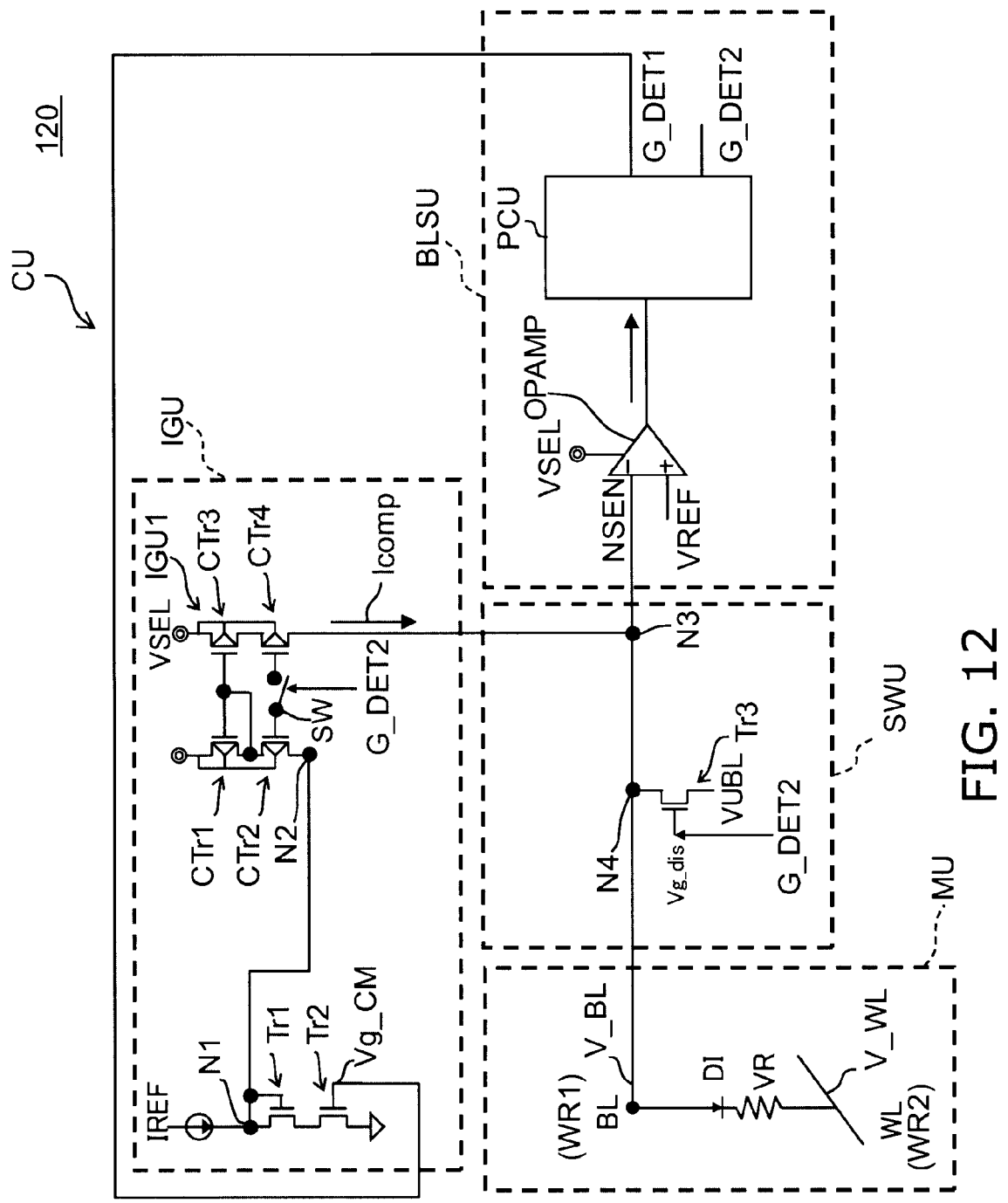
FIG. 12 is a circuit diagram illustrating the configuration of a nonvolatile memory device according to a second embodiment.

FIG. 12 is a circuit diagram illustrating the configuration of the nonvolatile memory device according to the second embodiment.

Namely, FIG. 12 illustrates the configuration of the circuit included in the nonvolatile memory device 120.

As illustrated in FIG. 12, the control unit CU of the nonvolatile memory device 120 also includes the current generation unit IGU, the bit line potential detection unit BLSU, and the switch unit SWU.

The current generation unit IGU includes the current mirror circuit IGU1, the current source IREF, the first transistor Tr1, and the second transistor Tr2. In the nonvolatile memory device 120, a switch SW is provided between the gate of the second current mirror transistor CTr2 and the gate of the fourth current mirror transistor CTr4 of the current mirror circuit IGU1. A second detection signal G_DET2 based on the detection result of the bit line potential V_BL from the bit line potential detection unit BLSU is input to the switch SW. The first detection signal G_DET1 is the first detection signal; and the second detection signal G_DET2 is the second detection signal. The electrical connection between the gate of the second current mirror transistor CTr2 and the gate of the fourth current mirror transistor CTr4 can be opened and closed according to the state of the signal input to the switch SW.

On the other hand, the second detection signal G_DET2 based on the detection result of the bit line BL from the bit line potential detection unit BLSU is reflectable to the discharge signal Vg_dis input to the gate of the third transistor Tr3 of the switch unit SWU.

Otherwise, the configuration of the control unit CU of the nonvolatile memory device 120 can be similar to that of the nonvolatile memory device 110, and a description is therefore omitted.

FIG. 13A to FIG. 13E are timing charts illustrating operations of the nonvolatile memory device according to the second embodiment.

The operations of the time t00 and the first time t01 to the sixth time t06 are similar to those described in regard to FIG. 7A to FIG. 7E.

Figure 13A:
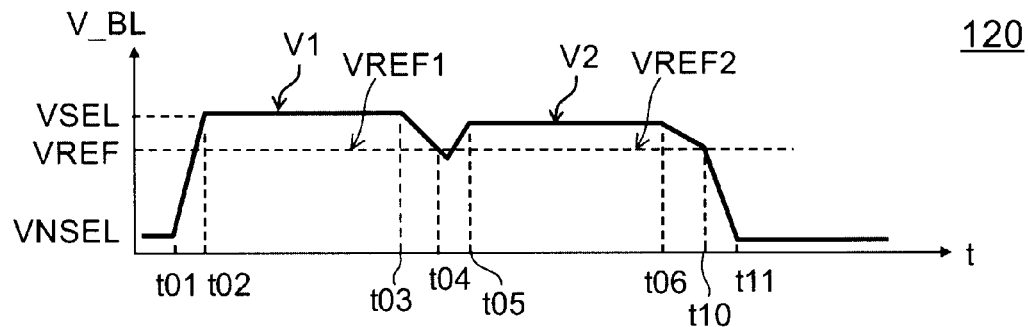
FIG. 13A to FIG. 13E are timing charts illustrating operations of the nonvolatile memory device according to the second embodiment.
Figure 13B:
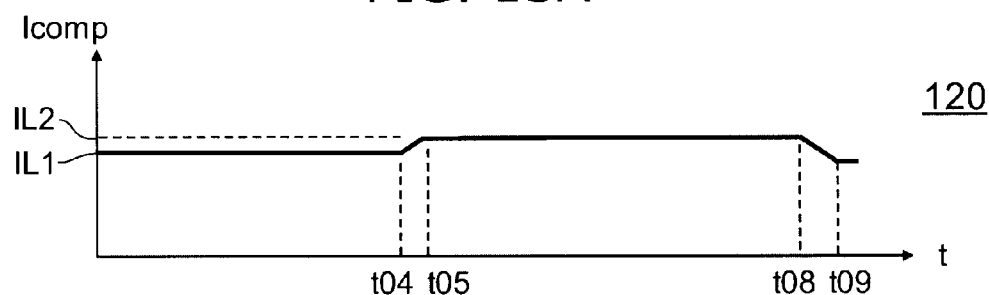
Figure 13C:
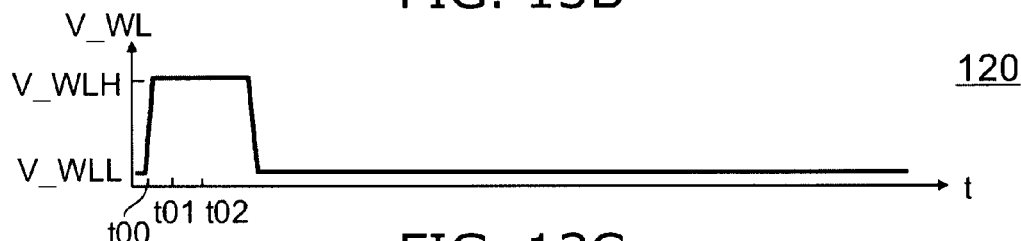
Figure 13D:
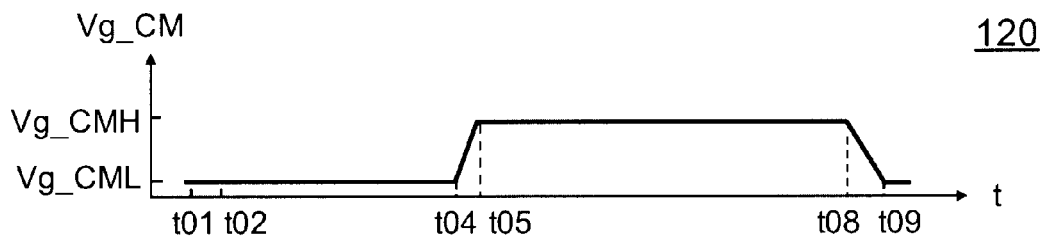
Figure 13E:
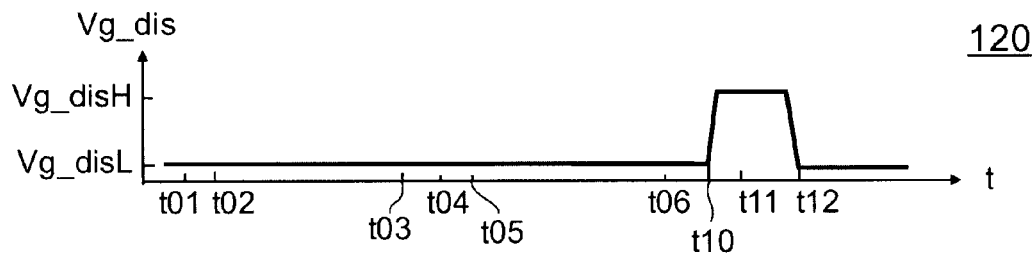

In other words, as illustrated in FIG. 13E, the discharge signal Vg_dis is set to the low voltage Vg_disL.

Then, at the time t00 and the first time t01 to the sixth time t06, the switch SW of the current mirror circuit IGU1 is in the closed state, and the gate of the second current mirror transistor CTr2 is electrically connected to the gate of the fourth current mirror transistor CTr4.

Therefore, in the state in which the current upper limit Icomp is set to the first value IL1, the bit line potential V_BL increases from the unselected voltage VNSEL at the first time t01; and the bit line potential V_BL reaches the selected voltage VSEL (in this specific example, the first voltage V1) at the second time t02. Then, the bit line potential V_BL starts to decrease at the third time t03 as the resistance of the resistance change layer VR decreases; and the bit line potential V_BL (the absolute value thereof) decreases to the predetermined reference value VREF (e.g., the first reference value VREF1) at the fourth time t04. Then, at the fourth time t04, the current control signal Vg_CM changes from the low voltage Vg_CML toward the high voltage Vg_CMH; and the current upper limit Icomp increases to the second value IL2.

Thereby, the bit line potential V_BL increases from the fourth time t04 and reaches the second voltage V2, for example, at the fifth time t05.

Subsequently, as illustrated in FIG. 13A, a current is supplied to the bit line BL in the state in which the current upper limit Icomp is increased to the second value IL2; and the resistance of the resistance change layer VR decreases further. Thereby, the bit line potential V_BL starts to decrease at the sixth time t06.

The decrease of the bit line potential V_BL is detected by the comparison circuit OPAMP; and the bit line potential V_BL (the absolute value thereof) decreases to the predetermined reference value VREF (e.g., a second reference value VREF2) at a tenth time t10. Although the second reference value VREF2 is set to be the same as the first reference value VREF1 in this specific example, the second reference value VREF2 may be greater than the first reference value VREF1 or less than the first reference value VREF1.

At the tenth time t10 where the bit line potential V_BL decreases to the reference value VREF for the second time, the second detection signal G_DET2 which is the second detection signal is reflected to the discharge signal Vg_dis.

In other words, at the tenth time t10 as illustrated in FIG. 13E, the discharge signal Vg_dis increases from the low voltage Vg_disL toward the high voltage Vg_disH. Then, at the tenth time t10, the second detection signal G_DET2 based on the detection result of the bit line potential V_BL is input to the switch SW; the switch SW is switched to the opened state; and the electrical connection between the gate of the second current mirror transistor CTr2 and the gate of the fourth current mirror transistor CTr4 is broken.

Thereby, as illustrated in FIG. 13A, an end operation of the supply of the current to the bit line BL is implemented at the tenth time t10. In other words, at the tenth time t10, the bit line potential V_BL abruptly decreases from the tenth time t10 to become the unselected voltage VNSEL at an eleventh time t11.

Then, as illustrated in FIG. 13E, the discharge signal Vg_dis becomes the low voltage Vg_disL at a twelfth time t12 after the eleventh time t11.

Subsequently, at the eighth time t08, the current control signal Vg_CM starts to change from the high voltage Vg_CMH toward the low voltage Vg_CML and reaches the low voltage Vg_CML at the ninth time t09. Thereby, the current upper limit Icomp starts to change from the second value IL2 toward the first value IL1 and returns to the initial first value IL1 at the ninth time t09.

Thus, in the nonvolatile memory device 120 according to this embodiment, the control unit CU performs the first current supply (the supply of the current in which the current is limited to the current upper limit Icomp of the first value IL1) and the second current supply (the supply of the current in which the current is limited to the current upper limit Icomp of the second value IL2) described in regard to the first embodiment; and in the second current supply, the control unit CU further detects the bit line potential V_BL and reduces the voltage applied to the bit line BL (applies, for example, the unselected voltage VNSEL to the bit line BL) when the absolute value of the bit line potential V_BL decreases to the predetermined reference value VREF (the second reference value VREF2).

Thus, in the nonvolatile memory device 120, the control unit CU in the set operation changes the voltage applied to the bit line BL to a voltage (e.g., the unselected voltage) having an absolute value less than the absolute value of the voltage (e.g., the voltage of the first current supply) applied prior to increasing the current upper limit Icomp based on a change of the potential of the bit line BL (the bit line potential V_BL) after increasing the upper limit of the current (the current upper limit Icomp) (after the fourth time t04). The absolute value of the latter voltage (e.g., the unselected voltage) is less than the absolute value of the voltage in the second current supply.

Thus, in the nonvolatile memory device 120, the control unit CU in the set operation implements the end operation of the supply of the current based on the change of the potential of the bit line BL after increasing the upper limit of the current (after the fourth time t04).

Thereby, the application of an excessive pulse to the memory cell MC can be suppressed. Thereby, the set state (the low resistance state) can be controlled with good precision.

Third Embodiment

The configuration of a nonvolatile memory device 130 according to a third embodiment can be similar to that of the nonvolatile memory device 110, and a description is therefore omitted. Operations of the nonvolatile memory device 130 will now be described.

Figure 14A:
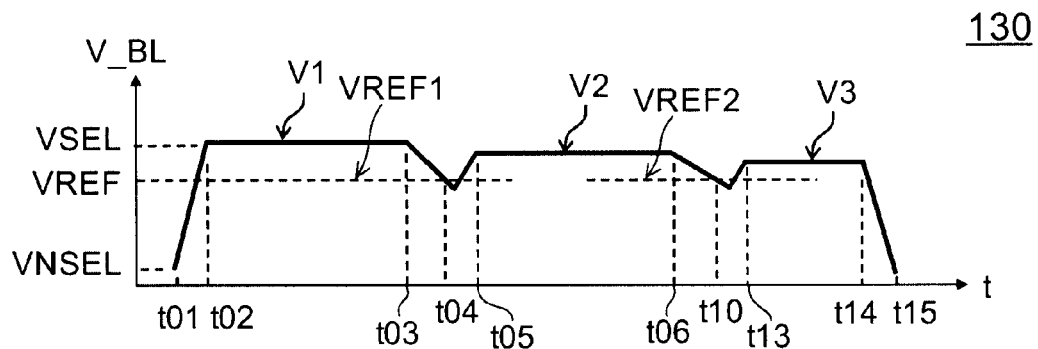
FIG. 14A and FIG. 14B are timing charts illustrating operations of a nonvolatile memory device according to a third embodiment.
Figure 14B:
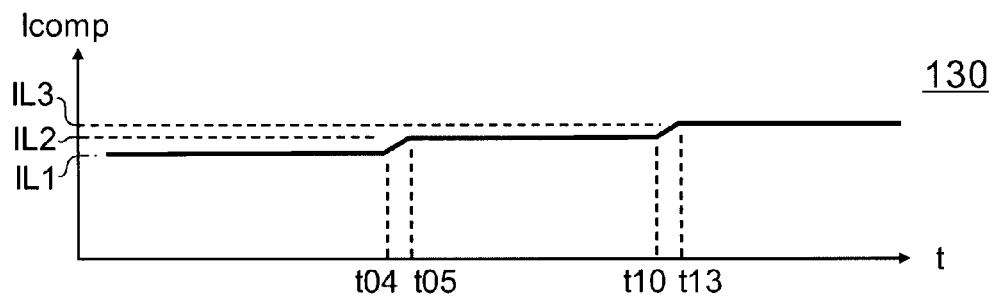

FIG. 14A and FIG. 14B are timing charts illustrating operations of the nonvolatile memory device according to the third embodiment.

In the nonvolatile memory device 130 according to this embodiment, the operations prior to the first time t01 to the sixth time t06 are similar to the operations of the nonvolatile memory device 110 illustrated in FIGS. 2A and 2B. Therefore, a description is omitted; and the operations from the sixth time t06 will be described.

As illustrated in FIG. 14A, a current is supplied to the bit line BL in the state in which the current upper limit Icomp is increased to the second value IL2; and the resistance of the resistance change layer VR decreases further. Thereby, the bit line potential V_BL starts to decrease at the sixth time t06.

The decrease of the bit line potential V_BL is detected by the comparison circuit OPAMP; and the bit line potential V_BL (the absolute value thereof) decreases to the predetermined reference value VREF (e.g., the second reference value VREF2) at the tenth time t10. The second reference value VREF2 may be greater than the first reference value VREF1 or less than the first reference value VREF1.

Then, the current upper limit Icomp is increased further at the tenth time t10.

In other words, at the tenth time t10 as illustrated in FIG. 14B, the current upper limit Icomp increases from the second value IL2 toward a third value IL3 which is greater than the second value IL2. Then, at a thirteenth time t13, the current upper limit Icomp reaches the third value IL3.

Then, as illustrated in FIG. 14A, the bit line potential V_BL increases from the tenth time t10 to reach, for example, a third voltage V3 at the thirteenth time t13. At this time, the selected voltage VSEL may be reduced such that the third voltage V3 is lower than the second voltage V2. Thereby, the controllability of the set operation is increased further. Then, for example, at a fourteenth time t14 after a predetermined amount of time, the set voltage Vset is set to, for example, the unselected voltage VNSEL; and the bit line potential V_BL returns to the unselected voltage VNSEL at a fifteenth time t15 after a slight time delay.

Thus, in the nonvolatile memory device 130 according to this embodiment, the first current supply, in which the current upper limit Icomp is set to the first value IL1 (step S110), the second current supply in which the current upper limit Icomp is increased to the second value IL2 when the bit line potential V_BL decreases to the reference value VREF (the first reference value VREF1) (step S120), and a third current supply, in which the current upper limit Icomp is increased to the third value IL3 when the bit line potential V_BL decreases to the reference value VREF (the second reference value VREF2), are implemented. Thereby, the controllability of the set operation can be increased further.

Thus, the control unit CU in the set operation changes the upper limit of the current (the current upper limit Icomp) based on the change of the potential of the bit line BL (the bit line potential V_BL) after increasing the upper limit of the current (the current upper limit Icomp) (after the fourth time t04). For example, the upper limit of the current (the current upper limit Icomp) is increased. In other words, the control unit CU changes the current upper limit Icomp at the tenth time t10 after increasing the current upper limit Icomp at the fourth time t04. For example, the current upper limit Icomp is increased.

For example, the control unit CU detects the bit line potential V_BL when the current upper limit Icomp is increased to, for example, the second value IL2 and further increases the current upper limit Icomp when the absolute value of the bit line potential V_BL detected when the current upper limit Icomp is increased to the second value IL2 decreases to the value of the predetermined reference value (e.g., the second reference value VREF2). For example, the current upper limit Icomp is increased to the third value IL3 which is greater than the second value IL2.

Further, any number of current supplies may be implemented in addition to the first current supply, the second current supply, and the third current supply recited above. In other words, an nth current supply, in which the current upper limit Icomp is set to an nth value ILn which is greater than the (n−1)th value IL(n−1) based on the change of the bit line potential V_BL, may be implemented n times, where n is an integer not less than 2.

The operations according to this embodiment and the operations according to the second embodiment may be implemented in combination. In other words, the voltage applied to the bit line BL can be changed to a voltage (e.g., the unselected voltage VNSEL) having an absolute value less than the absolute value of the set operation voltage V when the bit line potential V_BL decreases to a predetermined reference value after an nth current supply, in which the current upper limit Icomp is set to the nth value ILn which is greater than the (n−1)th value IL(n−1) based on the change of the bit line potential V_BL, is implemented. In other words, the end operation of the supply of the current is implemented when the bit line potential V_BL decreases to the predetermined reference value after the nth current supply, in which the current upper limit Icomp is set to the nth value ILn which is greater than the (n−1)th value IL(n−1) based on the change of the bit line potential V_BL, is implemented n times.

An example of the configuration of a nonvolatile memory device according to an embodiment will now be described. Although the nonvolatile memory device 110 described in regard to the first embodiment will now be described as the nonvolatile memory device, the following description can be applied also to the nonvolatile memory devices 120 and 130 according to the second and third embodiments.

Figure 15:
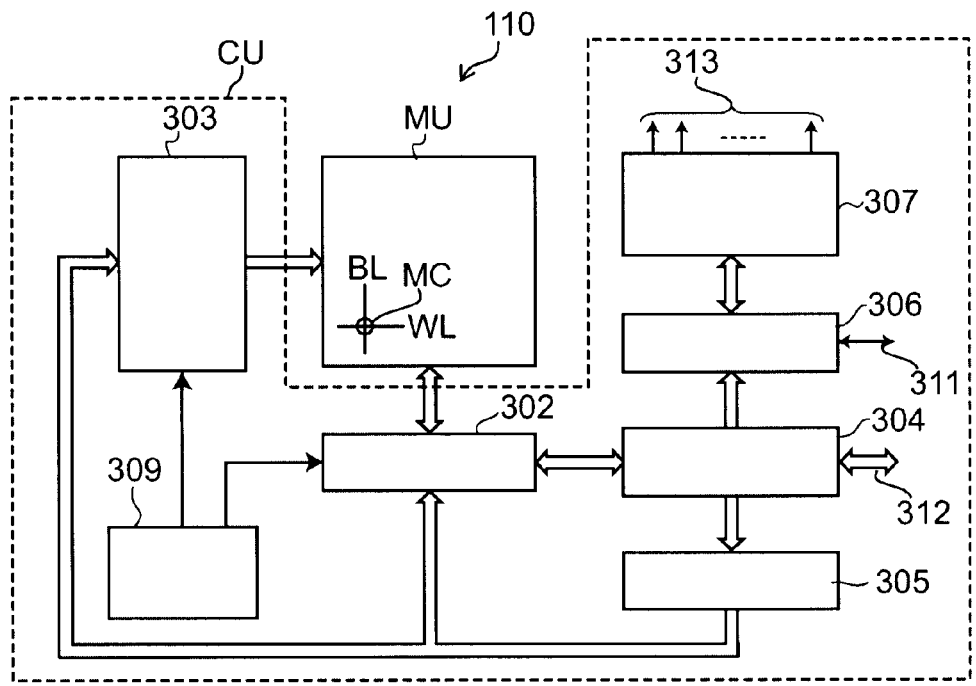
FIG. 15 is a block diagram illustrating the configuration of the nonvolatile memory device according to the embodiment.

FIG. 15 is a block diagram illustrating the configuration of the nonvolatile memory device according to the embodiment.

As illustrated in FIG. 15, the memory unit MU and the control unit CU are provided in the nonvolatile memory device 110.

As described above, the memory unit MU may include the multiple bit lines BL, the multiple word lines WL, and the memory cells MC provided therebetween. The memory cells MC include the resistance change layers VR. In other words, the memory unit MU includes a memory cell array including the memory cells MC disposed in a matrix configuration.

The control unit CU includes, for example, a column control circuit 302, a row control circuit 303, a data input/output buffer 304, an address register 305, a command interface 306, a state machine 307, and a pulse generator 309.

The column control circuit 302 controls, for example, the bit lines BL of the memory unit MU and performs the erasing of the data of the memory cells MC, the programming of the data to the memory cells MC, and the read out of the data from the memory cells MC. The programming of the data corresponds to, for example, the set operation; and the erasing of the data corresponds to, for example, the reset operation.

The row control circuit 303 selects, for example, the word lines WL of the memory unit MU and applies the voltage to the word lines WL necessary for the erasing of the data of the memory cells MC, the programming of the data to the memory cells MC, and the data read out from the memory cells MC.

The data input/output buffer 304 is connected to, for example, an external host (not illustrated) of the nonvolatile memory device 110 via an I/O line 312. The data input/output buffer 304 receives program data, receives erase commands, outputs read-out data, and receives address data and command data. The data input/output buffer 304 sends the received program data to the column control circuit 302 and outputs the read-out data received from the column control circuit 302 to the outside.

The addresses supplied to the data input/output buffer 304 from the outside are sent to the column control circuit 302 and the row control circuit 303 via the address register 305.

The commands supplied to the data input/output buffer 304 from the external host are sent to the command interface 306.

The command interface 306 receives an external control signal 311 supplied from the external host. The command interface 306 determines whether the data input to the data input/output buffer 304 is program data, a command, or an address and transfers the data to the state machine 307 as a received command signal in the case where the data is a command.

The state machine 307 manages the operations of the nonvolatile memory device 110. The state machine 307 supplies an internal control signal 313 to the column control circuit 302, the row control circuit 303, the data input/output buffer 304, the command interface 306, and the pulse generator 309. The state machine 307 receives, for example, commands from the external host via the command interface 306 and manages the read out, the programming, the erasing, the input/output of the data, and the like. It is also possible for the external host to receive the status information managed by the state machine 307 and determine the operation result. The status information also may be utilized to control the programming and the erasing.

The state machine 307 controls the pulse generator 309. By such control, it is possible for the pulse generator 309 to output a pulse having any voltage and any timing.

The pulse output from the pulse generator 309 can be supplied to any interconnect (bit line BL) controlled by the column control circuit 302 and any interconnect (word line WL) selected by the row control circuit 303.

The control unit CU may be provided, for example, on a silicon substrate; and the memory unit MU may be provided on the control unit CU. Thereby, the chip surface area of the nonvolatile memory device 110 can be substantially the same as the surface area of the memory unit MU.

Figure 16:
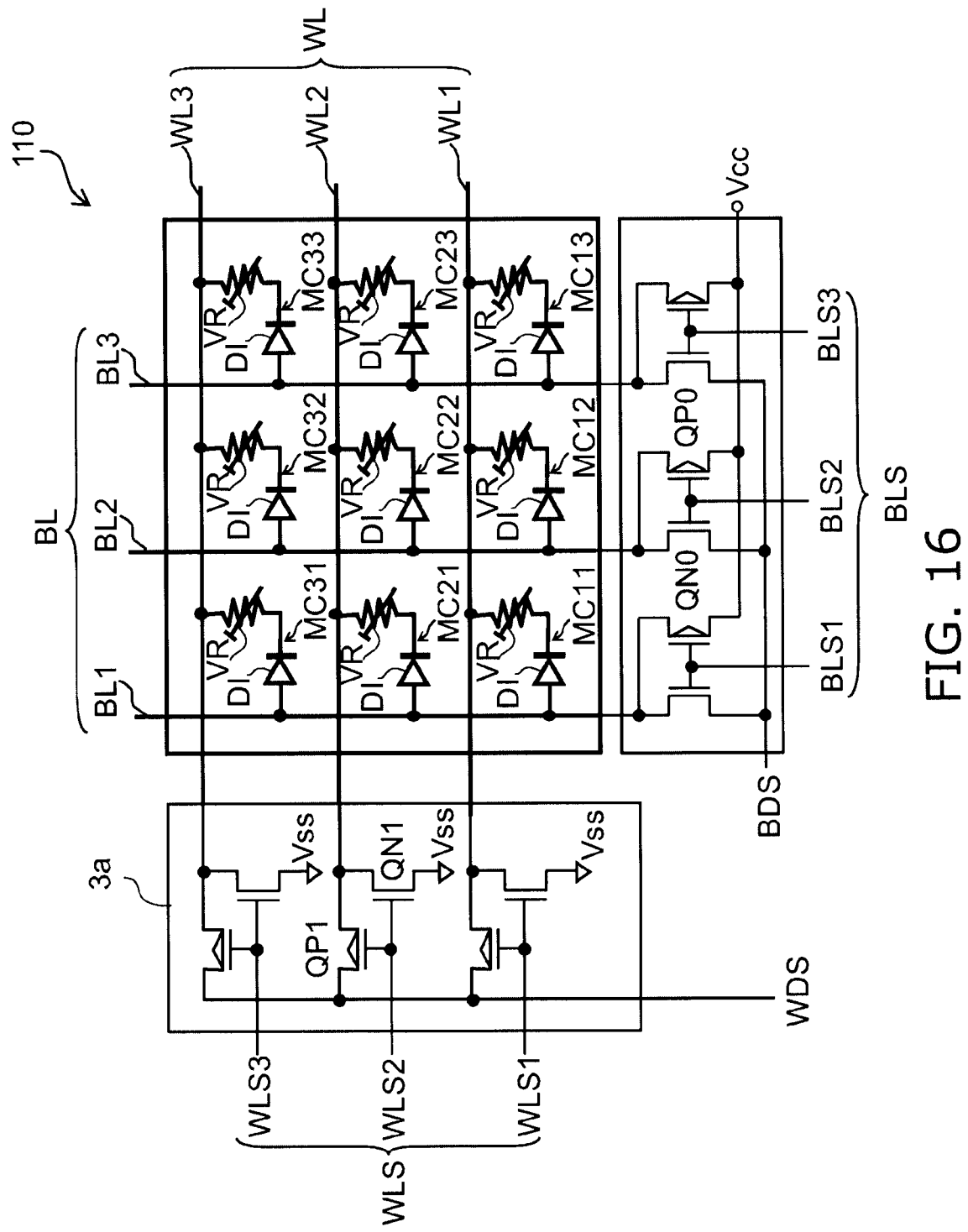
FIG. 16 is a circuit illustrating the configuration of the nonvolatile memory device according to the embodiment.

FIG. 16 is a circuit illustrating the configuration of the nonvolatile memory device according to the embodiment.

Although the illustration is for three bit lines BL and three word lines WL for simplification in FIG. 16, the number of the bit lines BL and the number of the word lines WL are arbitrary.

As illustrated in FIG. 16, the memory cells MC (memory cells MC11, MC12, MC13, MC21, MC22, M23, MC31, MC32, MC33, etc.) are provided at the intersections between the bit lines BL (the first to third bit lines BL1 to BL3) and the word lines WL (the first to third word lines WL1 to WL3). The resistance change layer VR and the rectifying element DI are connected in series in each of the memory cells MC.

Each of the bit lines BL is connected to a column-side selection circuit 302a. The column-side selection circuits 302a are included in the column control circuit 302. Each of the word lines WL is connected to a row-side selection circuit 303a. The row-side selection circuits 303a are included in the row control circuit 303.

The column-side selection circuit 302a may include, for example, a set of a bit line-side selection PMOS transistor QP0 and a bit line-side selection NMOS transistor QN0 provided for every bit line BL. The gate of the bit line-side selection PMOS transistor QP0 has a common connection with the gate of the bit line-side selection NMOS transistor QN0. The drain of the bit line-side selection PMOS transistor QP0 has a common connection with the drain of the bit line-side selection NMOS transistor QN0.

The source of the bit line-side selection PMOS transistor QP0 is connected to a high voltage power source Vcc. The source of the bit line-side selection NMOS transistor QN0 is connected to a bit line-side drive sense line BDS. The bit line-side drive sense line BDS supplies the program pulse and supplies the current to be detected during the data read out.

The common drain of the bit line-side selection PMOS transistor QP0 and the bit line-side selection NMOS transistor QN0 is connected to the bit line BL. Bit line selection signals BLS (the first to third bit line selection signals BLS1 to BLS3) that select the bit lines BL respectively are supplied to the common gates of the bit line-side selection PMOS transistors QP0 and the bit line-side selection NMOS transistors QN0.

The row-side selection circuit 303a includes, for example, a set of a word line-side selection PMOS transistor QP1 and a word line-side selection NMOS transistor QN1 provided for every word line WL. The gate of the word line-side selection PMOS transistor QP1 has a common connection with the gate of the word line-side selection NMOS transistor QN1. The drain of the word line-side selection PMOS transistor QP1 has a common connection with the drain of the word line-side selection NMOS transistor QN1.

The source of the word line-side selection PMOS transistor QP1 is connected to a word line-side drive sense line WDS. The word line-side drive sense line WDS supplies the program pulse and supplies the current to be detected during the data read out. The source of the word line-side selection NMOS transistor QN1 is connected to a low potential power source Vss.

The common drain of the word line-side selection PMOS transistor QP1 and the word line-side selection NMOS transistor QN1 is connected to the word line WL. Word line selection signals WLS (the first to third word line selection signals WLS1 to WLS3) that select the word lines WL respectively are supplied to the common gates of the word line-side selection PMOS transistors QP1 and the word line-side selection NMOS transistors QN1.

The configuration recited above is an example suited to selecting the memory cells MC individually.

On the other hand, in the case where the data of the multiple memory cells MC coupled to the selected word line WL are read collectively, for example, a configuration may be employed in which a sense amplifier is disposed individually for each of the bit lines BL, and each of the bit lines BL is connected individually to the sense amplifier by the bit line selection signal BLS via the column-side selection circuit 302a.

Figure 17:
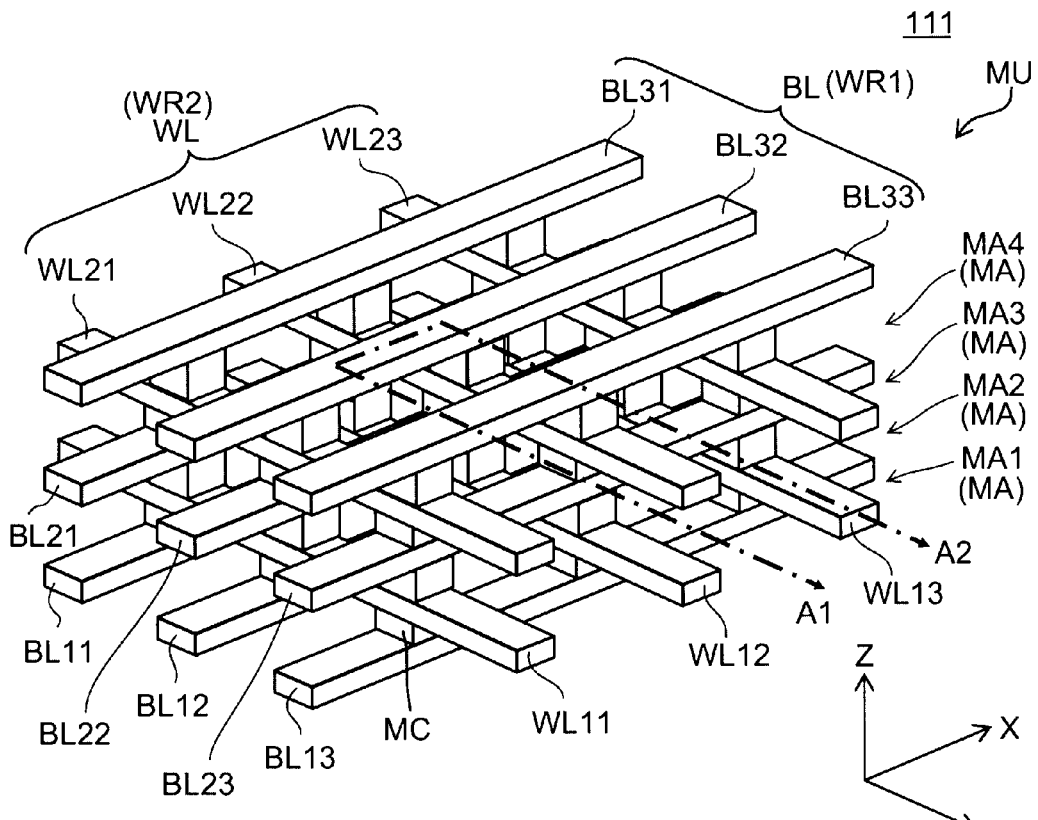
FIG. 17 is a schematic perspective view illustrating the configuration of a portion of one other nonvolatile memory device according to the embodiment.

FIG. 17 is a schematic perspective view illustrating the configuration of a portion of one other nonvolatile memory device according to the embodiment.

Figure 18:
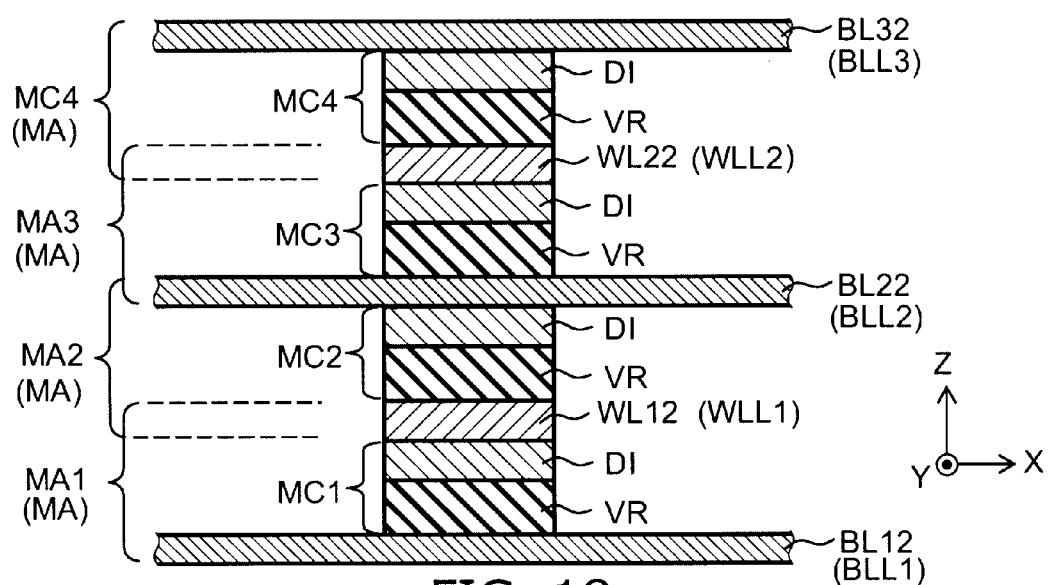
FIG. 18 is a schematic cross-sectional view illustrating the configuration of a portion of the one other nonvolatile memory device according to the embodiment.

FIG. 18 is a schematic cross-sectional view illustrating the configuration of a portion of the one other nonvolatile memory device according to the embodiment. Namely, FIG. 18 is a cross-sectional view along line A1-A2 of FIG. 17.

As illustrated in FIG. 17 and FIG. 18, the memory unit MU of the nonvolatile memory device 111 according to the embodiment includes multiple component memory layers MA stacked on each other. The multiple component memory layers MA are stacked, for example, along the Z-axis direction. Although four component memory layers MA, i.e., the first to fourth component memory layers MA1 to MA4, are provided in this specific example, the number of the component memory layers MA is arbitrary.

Each of the component memory layers MA includes the first interconnects WR1, the second interconnects WR2, and the memory cells MC including the resistance change layers VR provided between the first interconnects WR1 and the second interconnects WR2.

In other words, the first component memory layer MA1 includes first layer bit lines BLL1 (including bit lines BL11, BL12, and BL13), first layer word lines WLL1 (including word lines WL11, WL12, and WL13), and first layer memory cells MC1.

The second component memory layer MA2 includes second layer bit lines BLL2 (including bit lines BL21, BL22, and BL23), the first layer word lines WLL1 (including the word lines WL11, WL12, and WL13), and second layer memory cells MC2.

The third component memory layer MA3 includes the second layer bit lines BLL2 (including the bit lines BL21, BL22, and BL23), second layer word lines WLL2 (including word lines WL21, WL22, and WL23), and third layer memory cells MC3.

The fourth component memory layer MA4 includes third layer bit lines BLL3 (including bit lines BL31, BL32, and BL33), the second layer word lines WLL2 (including the word lines WL21, WL22, and WL23), and fourth layer memory cells MC4.

Thus, in the nonvolatile memory device 111, the component memory layers MA adjacent along the Z-axis direction share the bit lines BL or the word lines WL. However, the embodiment is not limited thereto. For example, an interlayer insulating film may be provided between the component memory layers MA adjacent along the Z-axis direction; and the bit lines BL and the word lines WL may be provided for each of the component memory layers MA. In such a case, the extension direction of the bit lines BL and the extension direction of the word lines WL are arbitrary for each of the component memory layers MA.

The configuration described in regard to the nonvolatile memory device 110 can be applied to the configuration of each of the component memory layers MA. The operations described in regard to the nonvolatile memory devices 110, 120, and 130 can be applied to the operations of each of the component memory layers MA.

Although the stacking order of the resistance change layer VR and the rectifying element DI is the same for each of the component memory layers MA in the example illustrated in FIG. 18, the stacking order of the resistance change layer VR and the rectifying element DI is arbitrary. For example, the stacking order of the resistance change layer VR and the rectifying element DI may be inverted for component memory layers MA adjacent along the Z-axis direction.

For example, the column control circuit 302 and the row control circuit 303 may be provided for each of the multiple component memory layers MA or may be shared by the multiple component memory layers MA.

Figure 19:
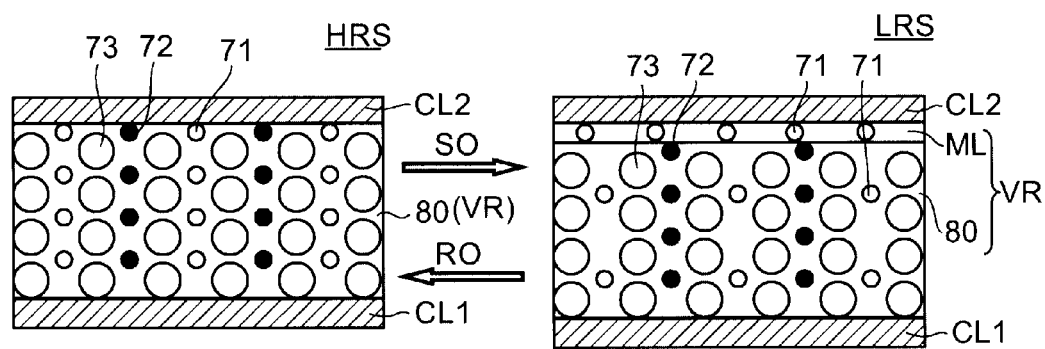
FIG. 19 is a schematic cross-sectional view illustrating operations of a resistance change layer of the nonvolatile memory device according to the embodiment.

FIG. 19 is a schematic cross-sectional view illustrating operations of the resistance change layer of the nonvolatile memory device according to the embodiment.

As illustrated in FIG. 19, the resistance change layer VR of the nonvolatile memory device according to the embodiment has a high resistance state HRS and a low resistance state LRS.

The resistance change layer VR includes, for example, a conjugated compound including at least two types of positive ion elements. For example, at least one type of positive ion element is a transition element having a d orbital incompletely filled with electrons; and the shortest distance between adjacent positive ion elements is not more than 0.32 nm.

For example, the resistance change layer VR includes a compound having, for example, the chemical formula $A_xM_yX_z$. In this chemical formula, the elements "A", "M", and "X" are different from each other. The resistance change layer VR includes a material having a crystalline structure such as, for example, a spinel structure ($AM_2O_4$), an ilmenite structure ($AMO_3$), a delafossite structure ($AMO_2$), a LiMoN$_2$ structure ($AMN_2$), a wolframite structure ($AMO_4$), an olivine structure ($A_2MO_4$), a hollandite structure ($A_xMO_2$), a ramsdellite structure ($A_xMO_2$), and a perovskite structure ($AMO_3$).

The resistance change layer VR may include, for example, $ZnMn_2O_4$ in which "A" is Zn, "M" is Mn, and "X" is O.

As illustrated in FIG. 19, the resistance change layer VR includes a compound layer 80 including diffusion ions 71 (e.g., Zn), negative ions 73 (e.g., O), and transition element ions 72 (e.g., Mn).

The following are implemented in a set operation SO of transitioning from the high resistance state HRS to the low resistance state LRS. In other words, when setting a first electrode layer CL1 to a reference potential and applying a negative voltage lower than the reference potential to a second electrode layer CL2 in the high resistance state HRS, a portion of the diffusion ions 71 inside the resistance change layer VR moves to the second electrode layer CL2 side; and the diffusion ions 71 in the resistance change layer VR decrease relative to the negative ions 73. The diffusion ions 71 that moved to the second electrode layer CL2 side receive electrons from the second electrode layer CL2, precipitate as a metal, and form a metal layer ML. The negative ions 73 become excessive in the interior of the resistance change layer VR; and as a result, the valence of the transition element ions 72 in the resistance change layer VR increases. Thereby, the resistance change layer VR is switched to a state in which electrons are conducted due to the injection of carriers; and the state transitions to the low resistance state LRS.

A reset operation RO of transitioning the low resistance state LRS (e.g., the program state) to the high resistance state HRS (e.g., the erase state) can be implemented by promoting an oxidation-reduction reaction in the resistance change layer VR by, for example, heating the resistance change layer VR using Joule heat by providing a large current to the resistance change layer VR for a sufficient amount of time. The reset operation RO also can be implemented by applying an electric field reverse to that of the set operation SO, i.e., for example, by applying a positive voltage to the second electrode layer CL2.

A reproduction operation (a read-out operation) of information in which the resistance state of the resistance change layer VR is detected can be implemented by detecting the resistance state of the resistance change layer VR while providing a current value minute enough not to cause a resistance change to occur in the material included in the resistance change layer VR.

Figure 20:
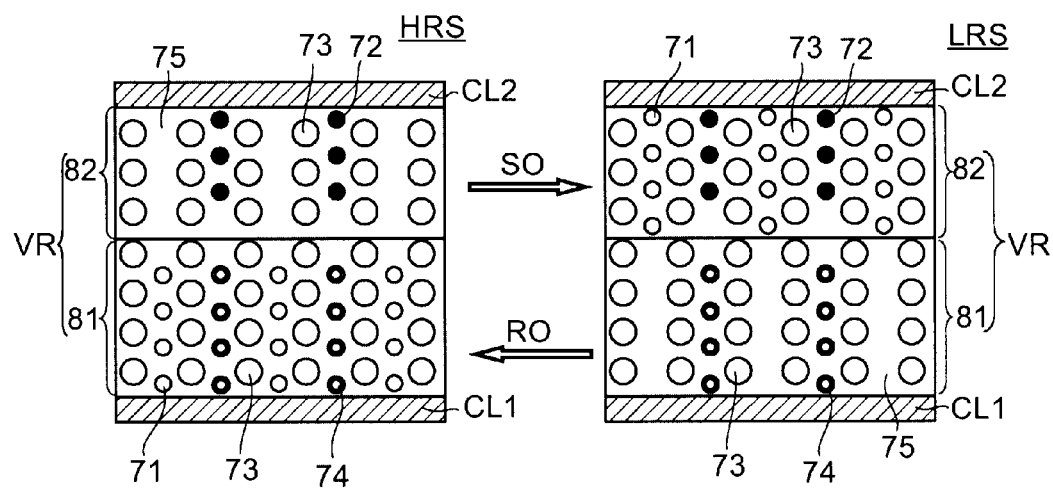
FIG. 20 is a schematic cross-sectional view illustrating operations of a resistance change layer of one other nonvolatile memory device according to the embodiment.

FIG. 20 is a schematic cross-sectional view illustrating operations of the resistance change layer of one other nonvolatile memory device according to the embodiment.

As illustrated in FIG. 20, the resistance change layer VR of the one other nonvolatile memory device according to the embodiment includes a first compound layer 81 and a second compound layer 82 stacked with the first compound layer 81.

The first compound layer 81 is provided, for example, on the first electrode layer CL1 side; and the second compound layer 82 is provided, for example, on the second electrode layer CL2 side.

The first compound layer 81 includes a compound having, for example, the chemical formula $A_xM1_yX1_z$. In this chemical formula, the elements "A", "M1", and "X1" are different from each other.

The second compound layer 82 has vacant sites 75 that can contain positive ion elements included in the first compound layer 81.

In the first compound layer 81 in this specific example, "A" is the Mg of the diffusion ions 71, "M1" is the Mn of the transition element ions, and "X1" is the O of the negative ions.

The second compound layer 82 includes the Ti of the transition element ions 72 and the oxygen of the negative ions 73; and the vacant sites 75 are provided in the second compound layer 82.

Although the case of one first compound layer 81 and one second compound layer 82 is illustrated in this specific example, at least one selected from the first compound layer 81 and the second compound layer 82 such as those recited above may be multiply provided; and such layers may be stacked.

In the case where a potential gradient is produced in such a resistance change layer VR by providing potentials to the first electrode layer CL1 and the second electrode layer CL2 such that the first compound layer 81 is the anode side and the second compound layer 82 is the cathode side, a portion of the diffusion ions 71 in the first compound layer 81 moves through the resistance change layer VR and enters into the second compound layer 82. Because the vacant sites 75 which can contain the diffusion ions 71 are provided in the second compound layer 82, the diffusion ions 71 moving from the first compound layer 81 side are contained in the vacant sites 75. Therefore, the valence of transition element ions 74 in the first compound layer 81 increases; and the valence of the transition element ions 72 in the second compound layer 82 decreases.

In other words, the resistance change layer VR has the state of, for example, $Mg^{2+}Mn^{3+}_2O^{2-}_4+\alpha Ti^{4+}_2O^{2-}_4$ in the high resistance state HRS; and the resistance change layer VR has the state of $\alpha Mg^{4+}_2O^{2-}_4+Mg^{2+}Ti^{3+}_2O^{2-}_4$ in the low resistance state LRS. Herein, the "α" of the chemical formulas recited above indicates a vacant site.

For example, when the resistance state of the first compound layer 81 and the resistance state of the second compound layer 82 are the high resistance state HRS, conduction carriers are produced in the crystals of the first compound layer 81 and the second compound layer 82 by providing a potential such as that recited above and by a portion of the diffusion ions 71 in the first compound layer 81 moving into the second compound layer 82; and the first compound layer 81 and the second compound layer 82 are switched to a conductive state. In other words, the set operation SO is executed.

The reset operation RO of transitioning from the low resistance state LRS to the high resistance state HRS can be implemented by promoting an oxidation-reduction reaction in the resistance change layer VR by, for example, heating the resistance change layer VR using Joule heat by providing a large current to the resistance change layer VR for a sufficient amount of time. The reset operation RO also can be implemented by applying an electric field reverse to that of the set operation SO to the resistance change layer VR.

The embodiment is not limited to that recited above. The resistance change layer VR may include any material. The resistance change layer VR may include, for example, a thin film including one selected from materials such as NiO, $TiO_2$, $SrZrO_3$, $Pr_{0.7}Ca_{0.3}MnO_3$, etc. The resistance change layer VR may include, for example, SiC.

The embodiment includes a method for driving the nonvolatile memory device. That is, the embodiment of the invention is a method for driving a nonvolatile memory device including the memory unit MU including: the first interconnect WR1; the second interconnect WR2 extending in a direction non-parallel to the extension direction of the first interconnect WR1; and the memory cell MC including the resistance change layer VR provided at the intersection between the first interconnect WR1 and the second interconnect WR2, where a resistance of the resistance change layer VR changes due to at least one selected from a voltage applied via the first interconnect WR1 and the second interconnect WR2 and a current flowing via the first interconnect WR1 and the second interconnect WR2. This driving method in the set operation SO, in which the resistance change layer VR is changed from a first state (the high resistance state HRS) having a first resistance value to a second state (the low resistance state LRS) having a second resistance value less than the first resistance value, increases the upper limit of the current (the current upper limit Icomp) supplied to the first interconnect WR1 based on the change of the potential of the first interconnect WR1 when applying the set operation voltage to the first interconnect WR1.

For example, as described in regard to FIG. 1 and FIGS. 2A and 2B, a current is supplied to the first interconnect WR1 while limiting the current to the upper limit recited above (the current upper limit Icomp) and detecting the potential of the first interconnect WR1 (step S110); and the upper limit (the current upper limit Icomp) is increased, for example, from the first value IL1 to the second value IL2 when the absolute value of the detected potential (the bit line potential V_BL) decreases to the predetermined reference value VREF.

As described above, according to the embodiments, a nonvolatile memory device having increased controllability of operations can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may similarly practice the invention by appropriately selecting specific configurations of components included in nonvolatile memory devices such as memory units, memory cells, resistance change layers, electrodes, rectifying elements, semiconductor layers, interconnects, control units, current generation units, bit line potential detection units, switch units, current mirror circuits, transistors, and the like from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all nonvolatile memory devices and methods for driving nonvolatile memory devices practicable by an appropriate design modification by one skilled in the art based on the nonvolatile memory devices and the methods for driving nonvolatile memory devices described above as embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention. For example, additions, deletions, or design modifications of components or additions, omissions, or condition modifications of processes appropriately made by one skilled in the art in regard to the embodiments described above are within the scope of the invention to the extent that the purport of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A nonvolatile memory device, comprising:
   a memory unit including:
      a first interconnect;
      a second interconnect extending in a direction non-parallel to an extension direction of the first interconnect;
      a memory cell including a resistance change layer provided at an intersection between the first interconnect and the second interconnect, a resistance of the resistance change layer to change due to at least one selected from a voltage applied via the first interconnect and the second interconnect and a current flowing via the first interconnect and the second interconnect; and
   a control unit connected to the first interconnect and the second interconnect to supply the at least one selected from the voltage and the current to the resistance change layer,
   the control unit being configured to increase an upper limit of a current supplied to the first interconnect based on a change of a potential of the first interconnect when applying a set operation voltage to the first interconnect in a set operation of changing the resistance change layer from a first state with a first resistance value to a second state with a second resistance value being less than the first resistance value.

2. The device according to claim 1, wherein the control unit supplies the current to the first interconnect while limiting the current to the upper limit and detecting the potential of the first interconnect and
   increases the upper limit when an absolute value of the detected potential decreases to a predetermined first reference value.

3. The device according to claim 1, wherein the control unit decreases an absolute value of the set operation voltage based on a change of the potential of the first interconnect.

4. The device according to claim 1, wherein the control unit in the set operation implements:
   a first current supply of supplying the first interconnect with a current having the upper limit of the current set to a first value; and
   a second current supply performed continually after the first current supply, the second current supply supplying the first interconnect with a current having the upper limit of the current set to a second value greater than the first value when the potential of the first interconnect decreases to a first reference value.

5. The device according to claim 1, wherein a waveform of the potential of the first interconnect in the set operation includes a first pulse and a second pulse continuing from the first pulse.

6. The device according to claim 1, wherein the control unit includes:
   a detection unit configured to detect the potential of the first interconnect and output a first detection signal reflecting a result of the detection; and
   a current generation unit including a current mirror circuit to receive input of the first detection signal, the current generation unit being configured to control the upper limit of the current supplied to the first interconnect based on the first detection signal.

7. The device according to claim 1, wherein the current supplied to the first interconnect includes a supply of a charge stored in a capacitor to the first interconnect.

8. The device according to claim 1, wherein the control unit in the set operation implements an end operation of the supply of the current based on a change of the potential of the first interconnect after the upper limit of the current is increased.

9. The device according to claim 2, wherein the control unit in the set operation detects the potential of the first interconnect after the upper limit of the current is increased and implements an end operation of the supply of the current when the absolute value of the potential detected when the upper limit of the current is increased decreases to a predetermined second reference value.

10. The device according to claim 9, wherein the control unit includes:
   a detection unit configured to detect the potential of the first interconnect and output a first detection signal and a second detection signal reflecting a result of the detection; and
   a current generation unit including a current mirror circuit to receive input of the first detection signal, the current generation unit being configured to supply the current to the first interconnect by controlling the upper limit of the current supplied to the first interconnect based on the first detection signal and to end the supply of the current to the first interconnect based on the second detection signal.

11. The device according to claim 9, wherein the control unit includes:
a detection unit configured to detect the potential of the first interconnect and output a first detection signal and a second detection signal reflecting a result of the detection;
a current generation unit including a current mirror circuit to receive input of the first detection signal, the current generation unit being configured to control the upper limit of the current supplied to the first interconnect based on the first detection signal; and
a switch unit connected to the first interconnect, the detection unit, and the current generation unit, the switch unit being configured to end the supply of the current from the current generation unit to the first interconnect based on the second detection signal.

12. The device according to claim 1, wherein the control unit in the set operation changes the upper limit based on a change of the potential of the first interconnect after the increasing the upper limit.

13. The device according to claim 1, wherein the control unit in the set operation detects the potential when the upper limit is increased and further increases the upper limit when an absolute value of the potential detected when the limit value is increased decreases to a predetermined third reference value.

14. The device according to claim 9, wherein the control unit in the set operation detects the potential when the upper limit is increased and further increases the upper limit when an absolute value of the potential detected when the limit value is increased decreases to a predetermined third reference value.

15. The device according to claim 1, wherein the control unit in the set operation implements:
a first current supply of supplying the first interconnect with a current having the upper limit of the current set to a first value;
a second current supply performed continually after the first current supply, the second current supply supplying the first interconnect with a current having the upper limit of the current set to a second value greater than the first value when the potential of the first interconnect decreases to a first reference value; and
a third current supply performed continuing from the supply of the second current after the second current supply, the third current supply supplying to the first interconnect a current having the upper limit of the current set to a third value greater than the second value when the potential of the first interconnect decreases to a second reference value.

16. The device according to claim 1, wherein the first interconnect is a bit line and the second interconnect is a word line.

17. The device according to claim 1, wherein the memory cell further includes at least one selected from a rectifying element provided between the first interconnect and the resistance change layer and a rectifying element provided between the second interconnect and the resistance change layer.

18. The device according to claim 1, wherein:
the memory cell further includes a first electrode, a second electrode, a third electrode, and a rectifying element provided between the first interconnect and the second interconnect;
the first electrode is disposed between the first interconnect and the resistance change layer;
the second electrode is disposed between the second interconnect and the resistance change layer;
the resistance change layer is disposed between the first electrode and the second electrode;
the rectifying element is disposed between the second interconnect and the second electrode;
the third electrode is disposed between the second interconnect and the rectifying element;
the second electrode includes at least one selected from W, WN, TaN, TaSiN, $TaSi_2$, TiN, TiC, TaC, and $Nb-TiO_2$;
the first electrode and the third electrode include at least one selected from Pt, Au, Ag, TiAlN, SrRuO, Ru, RuN, Ir, Co, Ti, TiN, TaN, LaNiO, Al, $PtIrO_x$, $PtRhO_x$, W, and Rh/TaAlN; and
the first interconnect and the second interconnect include at least one selected from W, WSi, NiSi, and CoSi.

19. The device according to claim 1, wherein the resistance change layer includes a material having a crystalline structure of at least one selected from a spinel structure, an ilmenite structure, a delafossite structure, a $LiMoN_2$ structure, a wolframite structure, an olivine structure, a hollandite structure, a ramsdellite structure, and a perovskite structure.

20. A method for driving a nonvolatile memory device including a memory unit, the memory unit including:
a first interconnect;
a second interconnect extending in a direction non-parallel to an extension direction of the first interconnect; and
a memory cell including a resistance change layer provided at an intersection between the first interconnect and the second interconnect, a resistance of the resistance change layer to change due to at least one selected from a voltage applied via the first interconnect and the second interconnect and a current flowing via the first interconnect and the second interconnect,
the method comprising:
increasing an upper limit of a current supplied to the first interconnect based on a change of a potential of the first interconnect when applying a set operation voltage to the first interconnect in a set operation of changing the resistance change layer from a first state with a first resistance value to a second state with a second resistance value being less than the first resistance value.

* * * * *